(12) United States Patent
Lin et al.

(10) Patent No.: US 10,622,077 B2
(45) Date of Patent: Apr. 14, 2020

(54) DECODING METHOD, MEMORY STORAGE DEVICE AND MEMORY CONTROL CIRCUIT UNIT

(71) Applicant: PHISON ELECTRONICS CORP., Miaoli (TW)

(72) Inventors: Wei Lin, Taipei (TW); Yu-Cheng Hsu, Yilan County (TW); Szu-Wei Chen, New Taipei (TW); Tien-Ching Wang, Miaoli County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 182 days.

(21) Appl. No.: 15/691,763

(22) Filed: Aug. 31, 2017

(65) Prior Publication Data
US 2018/0374543 A1    Dec. 27, 2018

(30) Foreign Application Priority Data

Jun. 22, 2017 (TW) .............................. 106120804 A

(51) Int. Cl.
*G11C 16/28* (2006.01)
*G06F 11/10* (2006.01)
(Continued)

(52) U.S. Cl.
CPC .......... *G11C 16/28* (2013.01); *G06F 11/1012* (2013.01); *G06F 11/1068* (2013.01);
(Continued)

(58) Field of Classification Search
CPC ............. G06F 11/1068; G06F 12/0246; G06F 11/1072; G06F 3/0679; G06F 3/0688;
(Continued)

(56) References Cited

U.S. PATENT DOCUMENTS

| 8,856,615 B1* | 10/2014 | Krishnan | H03M 13/2957 714/718 |
| 8,924,824 B1* | 12/2014 | Lu | G06F 11/1048 365/185.2 |
| 2014/0281800 A1* | 9/2014 | Micheloni | G06F 11/1012 714/759 |

FOREIGN PATENT DOCUMENTS

TW    I588834    6/2017

OTHER PUBLICATIONS

"Office Action of Taiwan Counterpart Application," dated Aug. 22, 2018, pp. 1-6.

* cited by examiner

*Primary Examiner* — April Y Blair
*Assistant Examiner* — Sazzad Hossain
(74) *Attorney, Agent, or Firm* — JCIPRNET

(57) ABSTRACT

A decoding method for a rewritable non-volatile memory module is provided according to an exemplary embodiment of the disclosure. The decoding method includes: reading first data from memory cells of the rewritable non-volatile memory module, wherein the first data includes a first bit stored in a first memory cell; obtaining a storage state of at least one second memory cell which is different from the first memory cell; obtaining first reliability information corresponding to the first bit according to the storage state of the second memory cell, wherein the first reliability information is different from default reliability information corresponding to the first bit; and decoding the first data according to the first reliability information. Therefore, a decoding efficiency can be improved.

33 Claims, 14 Drawing Sheets

404

(51) Int. Cl.
*G11C 16/08* (2006.01)
*G11C 11/56* (2006.01)
*G11C 29/52* (2006.01)
*G06F 12/02* (2006.01)
*H03M 13/11* (2006.01)
*H03M 13/37* (2006.01)
*G06F 3/06* (2006.01)

(52) U.S. Cl.
CPC .......... *G11C 11/5642* (2013.01); *G11C 16/08* (2013.01); *G06F 3/0688* (2013.01); *G06F 11/1004* (2013.01); *G06F 11/1072* (2013.01); *G06F 12/0246* (2013.01); *G11C 29/52* (2013.01); *H03M 13/1111* (2013.01); *H03M 13/3784* (2013.01)

(58) Field of Classification Search
CPC ..... G06F 11/1004; G11C 29/52; G11C 16/08; H03M 13/1111; H03M 13/45; H03M 13/3784
See application file for complete search history.

| voltage range | 1001 | 1002 | 1003 | 1004 | 1005 | 1006 |
|---|---|---|---|---|---|---|
| default reliability information | −12 | −8 | −2 | +2 | +8 | +12 |

| storage state of adjacent memory cell | first state (Er, A, B or C) | second state (D, E, F or G) |
|---|---|---|
| adjustment value of reliability information | −Δ | +Δ |

DECODING METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 106120804, filed on Jun. 22, 2017. The entirety of the above-mentioned patent application is hereby incorporated by reference herein and made a part of this specification.

BACKGROUND

Technology Field

The disclosure relates to a decoding technique, and in particular, to a decoding method, a memory storage device, and a memory control circuit unit.

Description of Related Art

As digital cameras, mobile phones, and MP3 players have been growing rapidly in recent years, consumers' demand for storage media has also been growing significantly. With characteristics including data non-volatility, energy saving, small size, lack of mechanical structures, etc., rewritable non-volatile memory modules (e.g., flash memories) are ideal to be built-in in various portable multi-media devices such as those listed above.

Data exists in memory cells of the rewritable non-volatile memory module in the form of electrical charges. During use of the rewritable non-volatile memory module, the electrical charges in the memory cells may be lost due to various factors, causing an error in reading of the memory cells. Therefore, in some memory storage devices, the data from a host system are encoded and then stored. When the host system is to read data, the encoded data are read and decoded so as to correct errors therein. Then, the decoded data that are verified to be unerroneous are transmitted to the host system. However, under certain circumstances, if too many errors exist in the read data, the read data may not be successfully decoded. In particular, if the rewritable non-volatile memory module includes memory cell arrays of a three-dimensional structure, it is more likely that the overly short distance between the memory cells may accelerate loss of electrical charges in the memory cells.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

In light of the above, the disclosure provides a decoding method, a memory storage device, and a memory control circuit unit, which are capable of enhancing a decoding efficiency.

An exemplary embodiment of the disclosure provides a decoding method for a rewritable non-volatile memory module including a plurality of memory cells, the decoding method including: reading first data from at least one memory cell among the memory cells, wherein the first data includes a first bit, and the first bit is stored in a first memory cell among the memory cells; obtaining a storage state of at least one second memory cell among the memory cells, wherein the second memory cell is different from the first memory cell; obtaining first reliability information corresponding to the first bit according to the storage state of the second memory cell, wherein the first reliability information is different from default reliability information corresponding to the first bit; and decoding the first data according to the first reliability information.

Another exemplary embodiment of the disclosure provides a memory storage device including a connection interface unit, a rewritable non-volatile memory module, and a memory control circuit unit. The connection interface unit is configured to couple to a host system. The rewritable non-volatile memory module includes a plurality of memory cells. The memory control circuit unit is coupled to the connection interface unit and the rewritable non-volatile memory module, wherein the memory control circuit unit is configured to issue a read command sequence which is configured to instruct reading first data from at least one memory cell among the memory cells, wherein the first data includes a first bit, and the first bit is stored in a first memory cell among the memory cells, wherein the memory control circuit unit is further configured to obtain a storage state of at least one second memory cell among the memory cells, wherein the second memory cell is different from the first memory cell, wherein the memory control circuit unit is further configured to obtain first reliability information corresponding to the first bit according to the storage state of the second memory cell, wherein the first reliability information is different from default reliability information corresponding to the first bit, wherein the memory control circuit unit is further configured to decode the first data according to the first reliability information.

Another exemplary embodiment of the disclosure provides a memory control circuit unit configured to control a rewritable non-volatile memory module including a plurality of memory cells, the memory control circuit unit including a host interface, a memory interface, an error checking and correcting circuit, and a memory management circuit. The host interface is configured to couple to a host system. The memory interface is configured to couple to the rewritable non-volatile memory module. The memory management circuit is coupled to the host interface, the memory interface, and the error checking and correcting circuit, wherein the memory management circuit is configured to issue a read command sequence configured to instruct reading first data from at least one memory cell among the memory cells, wherein the first data includes a first bit, and the first bit is stored in a first memory cell among the memory cells, wherein the memory management circuit is further configured to obtain a storage state of at least one second memory cell among the memory cells, wherein the second memory cell is different from the first memory cell, wherein the memory management circuit is further configured to obtain first reliability information corresponding to the first bit according to the storage state of the second memory cell, wherein the first reliability information is different from default reliability information corresponding to the first bit, wherein the error checking and correcting circuit is configured to decode the first data according to the first reliability information.

In light of the above, after the first data including the first bit stored in the first memory cell is read, the storage state of the second memory cell different from the first memory cell is obtained, and the first reliability information of the first bit is obtained based on the storage state of the second memory cell. Then, the decoding of the first data is performed according to the first reliability information to thereby enhance a success rate of decoding the first data.

To provide a further understanding of the aforementioned and other features and advantages of the disclosure, exemplary embodiments, together with the reference drawings, are described in detail below.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

FIG. 11 is a schematic diagram illustrating a first lookup table according to an exemplary embodiment of the disclosure.

FIG. 12 is a schematic diagram illustrating a second lookup table according to an exemplary embodiment of the disclosure.

DESCRIPTION OF THE EMBODIMENTS

Figure 1:
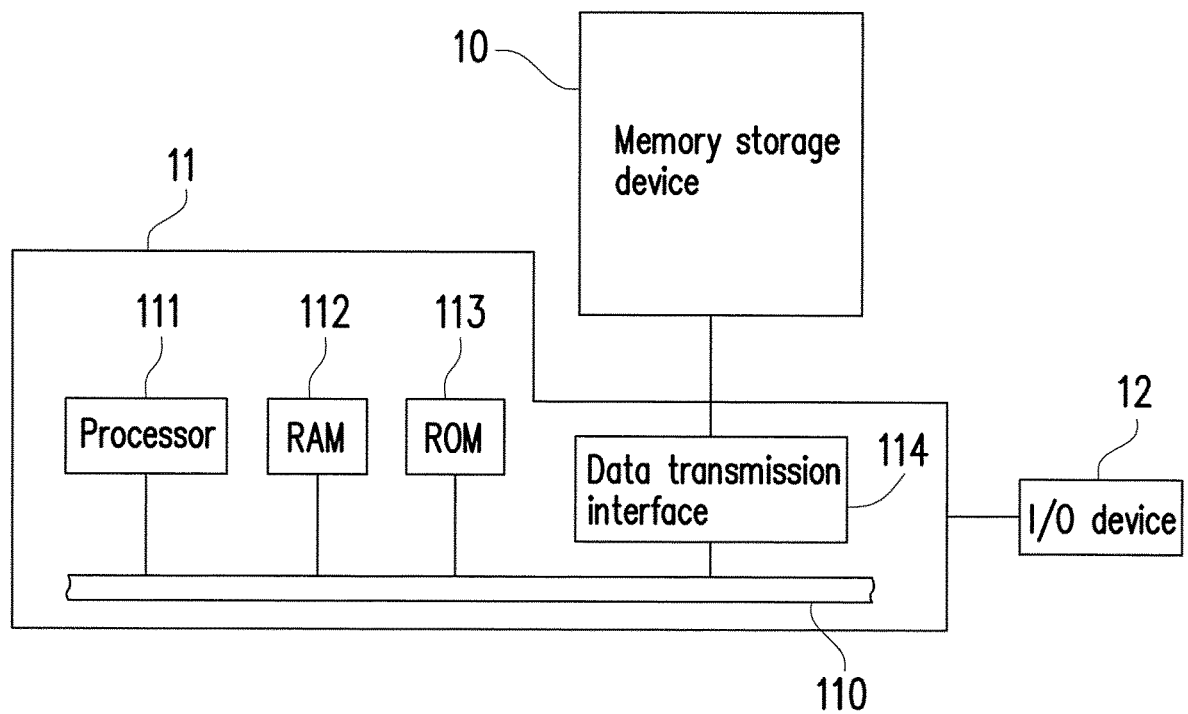
FIG. 1 is a schematic diagram illustrating a host system, a memory storage device, and an input/output (I/O) device according to an exemplary embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (also referred to as a memory storage system) includes a rewritable non-volatile memory module and a controller (also referred to as a control circuit). The memory storage device is usually used together with a host system, such that the host system can write data to or read data from the memory storage device.

Figure 2:
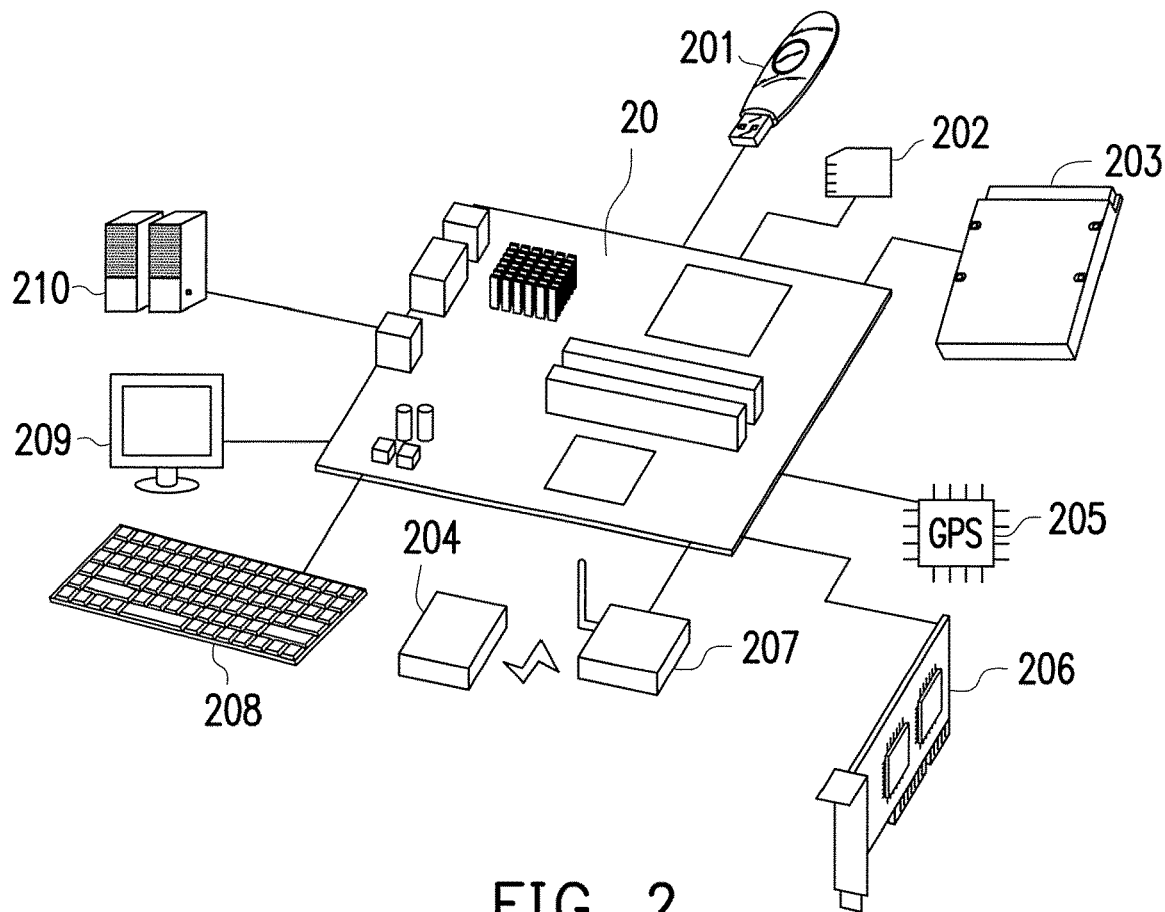
FIG. 2 is a schematic diagram illustrating a host system, a memory storage device, and an I/O device according to another exemplary embodiment of the disclosure.

FIG. 1 is a schematic diagram illustrating a host system, a memory storage device, and an input/output (I/O) device according to an exemplary embodiment of the disclosure. FIG. 2 is a schematic diagram illustrating a host system, a memory storage device, and an I/O device according to another exemplary embodiment of the disclosure.

Referring to FIG. 1 and FIG. 2, a host system 11 generally includes a processor 111, a random access memory (RAM) 112, a read only memory (ROM) 113, and a data transmission interface 114. The processor 111, the random access memory 112, the read only memory 113, and the data transmission interface 114 are all coupled to a system bus 110.

In the present exemplary embodiment, the host system 11 is coupled to a memory storage device 10 via the data transmission interface 114. For example, the host system 11 may store data to the memory storage device 10 or read data from the memory storage device 10 via the data transmission interface 114. Moreover, the host system 11 is coupled to the I/O device 12 via the system bus 110. For example, the host system 11 may transmit output signals to the I/O device 12 or receive input signals from the I/O device 12 via the system bus 110.

In the present exemplary embodiment, the processor 111, the random access memory 112, the read only memory 113, and the data transmission interface 114 may be installed on a motherboard 20 of the host system 11. The number of the data transmission interface 114 may be one or more. The motherboard 20 may be coupled to the memory storage device 10 via the data transmission interface 114 through wired or wireless manners. The memory storage device 10 is, for example, a flash drive 201, a memory card 202, a solid state drive (SSD) 203, or a wireless memory storage device 204. The wireless memory storage device 204 is a memory storage device based on various wireless communication technologies, such as a near field communication (NFC) memory storage device, a WiFi memory storage device, a Bluetooth memory storage device, or a Bluetooth Low Energy (BLE) memory storage device (e.g., iBeacon). Moreover, the motherboard 20 may also be coupled via the system bus 110 to various I/O devices, such as a global positioning system (GPS) module 205, a network interface card 206, a wireless transmission device 207, a keyboard 208, a screen 209, and a speaker 210. For example, in an exemplary embodiment, the motherboard 20 may access the wireless memory storage device 204 via the wireless transmission device 207.

Figure 3:
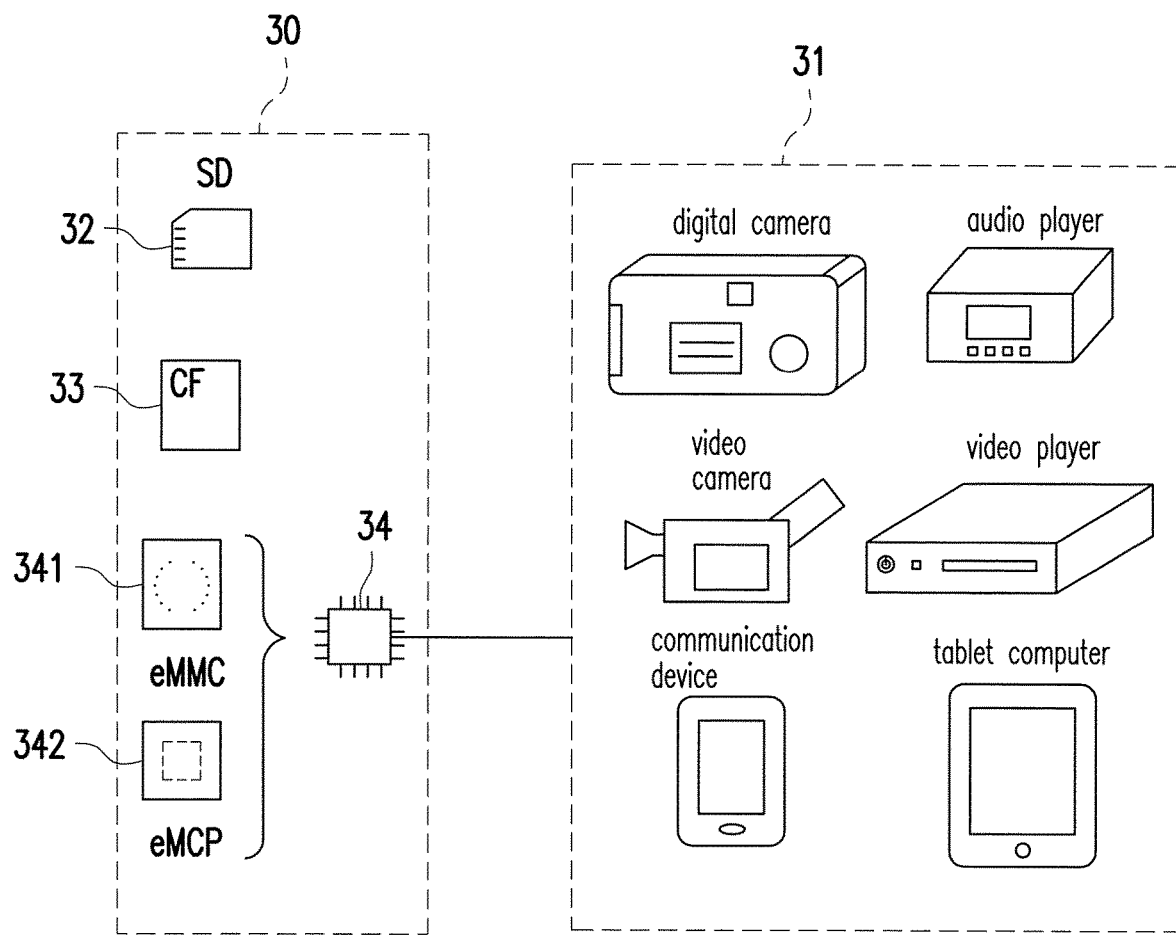
FIG. 3 is a schematic diagram illustrating a host system and a memory storage device according to another exemplary embodiment of the disclosure.

In an exemplary embodiment, the foregoing host system is any system that substantially works with the memory storage device to store data. In the exemplary embodiment above, the host system is illustrated with a computer system. However, FIG. 3 is a schematic diagram illustrating a host system and a memory storage device according to another exemplary embodiment of the disclosure. Referring to FIG. 3, in another exemplary embodiment, a host system 31 may also be a system such as a digital camera, a video camera, a communication device, an audio player, a video player, a tablet computer, etc. A memory storage device 30 is any one of various types of non-volatile memory storage devices used by the host system 31, such as a secure digital (SD) card 32, a compact flash (CF) card 33, an embedded storage device 34, etc. The embedded storage device 34 is any of various types of embedded storage devices directly coupling a memory module to a substrate of the host system, such as an embedded multi media card (eMMC) 341 and/or an embedded multi chip package (eMCP) storage device 342.

Figure 4:
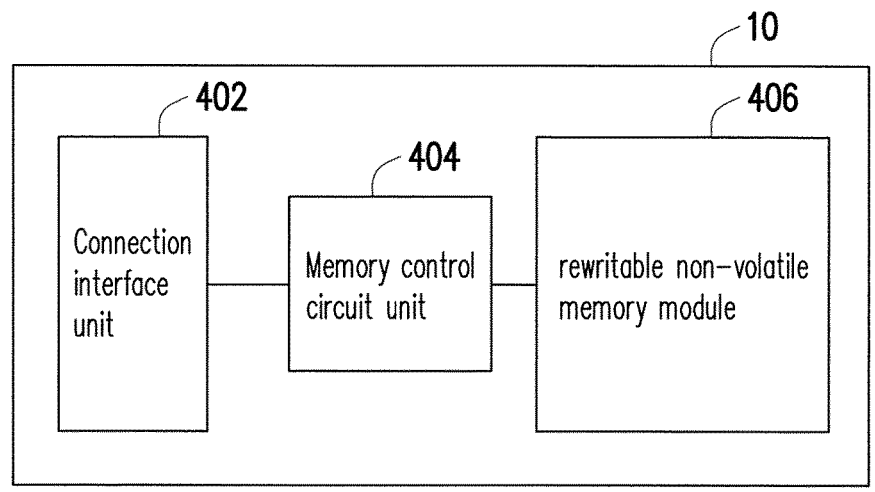
FIG. 4 is a schematic block diagram illustrating a memory storage device according to an exemplary embodiment of the disclosure.

FIG. 4 is a schematic block diagram illustrating a memory storage device according to an exemplary embodiment of the disclosure.

Referring to FIG. 4, the memory storage device 10 includes a connection interface unit 402, a memory control circuit unit 404, and a rewritable non-volatile memory module 406.

The connection interface unit 402 is configured to couple the memory storage device 10 to the host system 11. In the present exemplary embodiment, the connection interface unit 402 is compatible with the Serial Advanced Technology Attachment (SATA) standard. However, it is understood that the disclosure is not limited hereto. The connection interface unit 402 may also be compatible with the Parallel Advanced Technology Attachment (PATA) standard, the Institute of Electrical and Electronic Engineers (IEEE) 1394 standard, the Peripheral Component Interconnect Express (PCI Express) standard, the Universal Serial Bus (USB) standard, the SD interface standard, the Ultra High Speed-I (UHS-I) interface standard, the Ultra High Speed-II (UHS-II) interface standard, the Memory Stick (MS) interface standard, the MCP interface standard, the MMC interface standard, the eMMC interface standard, the Universal Flash Storage (UFS) interface standard, the eMCP interface standard, the CF interface standard, the Integrated Device Electronics (IDE) standard, or other suitable standards. The connection interface unit 402 may be packaged with the memory control circuit unit 404 in one single chip, or the connection interface unit 402 may be disposed outside a chip including the memory control circuit unit 404.

The memory control circuit unit 404 is configured to execute a plurality of logic gates or control commands implemented in a hardware form or a firmware form and perform operations, such as data writing, reading, erasing, etc., in the rewritable non-volatile memory module 406, according to commands of the host system 11.

The rewritable non-volatile memory module 406 is coupled to the memory control circuit unit 404 and is configured to store data written by the host system 11. The rewritable non-volatile memory module 406 may be a single level cell (SLC) NAND flash memory module (i.e., a flash memory module capable of storing 1 bit in one memory cell), a multi level cell (MLC) NAND flash memory module (i.e., a flash memory module capable of storing 2 bits in one memory cell), a triple level cell (TLC) NAND flash memory module (i.e., a flash memory module capable of storing 3 bits in one memory cell), another flash memory module, or any other memory modules with the same characteristics.

In the rewritable non-volatile memory module 406, one or more bits are stored by changing a voltage (hereinafter also referred to as a threshold voltage) of each of the memory cells. More specifically, in each of the memory cells, a charge trapping layer is provided between a control gate and a channel. An amount of electrons in the charge trapping layer may be changed by applying a write voltage to the control gate, thereby changing the threshold voltage of the memory cell. This operation of changing the threshold voltage of the memory cell is also known as "writing data to the memory cell" or "programming the memory cell". As the threshold voltage changes, each of the memory cells in the rewritable non-volatile memory module 406 has a plurality of storage states. The storage state to which a memory cell belongs may be determined by applying a read voltage, thereby obtaining the one or more bits stored in the memory cell.

In the present exemplary embodiment, the memory cells of the rewritable non-volatile memory module 406 constitute a plurality of physical programming units, and the physical programming units constitute a plurality of physical erasing units. Specifically, the memory cells on the same word line constitute one or more of the physical programming units. If each of the memory cells can store two bits or more, the physical programming units on the same word line can be at least classified into a lower physical programming unit and an upper physical programming unit. For example, a least significant bit (LSB) of one memory cell belongs to the lower physical programming unit, and a most significant bit (MSB) of one memory cell belongs to the upper physical programming unit. Generally, in the MLC NAND flash memory, a writing speed of the lower physical programming unit is higher than a writing speed of the upper physical programming unit, and/or a reliability of the lower physical programming unit is higher than a reliability of the upper physical programming unit.

In the present exemplary embodiment, the physical programming unit is the minimal unit for programming. In other words, the physical programming unit is the minimal unit for writing data. For example, the physical programming unit is a physical page or a physical sector. When the physical programming unit is the physical page, the physical programming units usually include a data bit area and a redundancy bit area. The data bit area includes a plurality of physical sectors for storing user data, and the redundancy bit area is configured to store system data (e.g., management data such as an error correcting code). In the present exemplary embodiment, the data bit area includes 32 physical sectors, and a size of each physical sector is 512 bytes (B). However, in other exemplary embodiments, the data bit area may also include 8 or 16 physical sectors or physical sectors of a greater or smaller number, and the size of each physical sector may also be greater or smaller. On the other hand, the physical erasing unit is the minimal unit for erasing. Namely, each physical erasing unit contains the least number of memory cells to be erased altogether. For example, the physical erasing unit is a physical block.

In the present exemplary embodiment, the memory cells in the rewritable non-volatile memory module 406 are disposed in a three-dimensional array. However, in another exemplary embodiment, the memory cells in the rewritable non-volatile memory module 406 are disposed in a two-dimensional array.

Figure 5A:
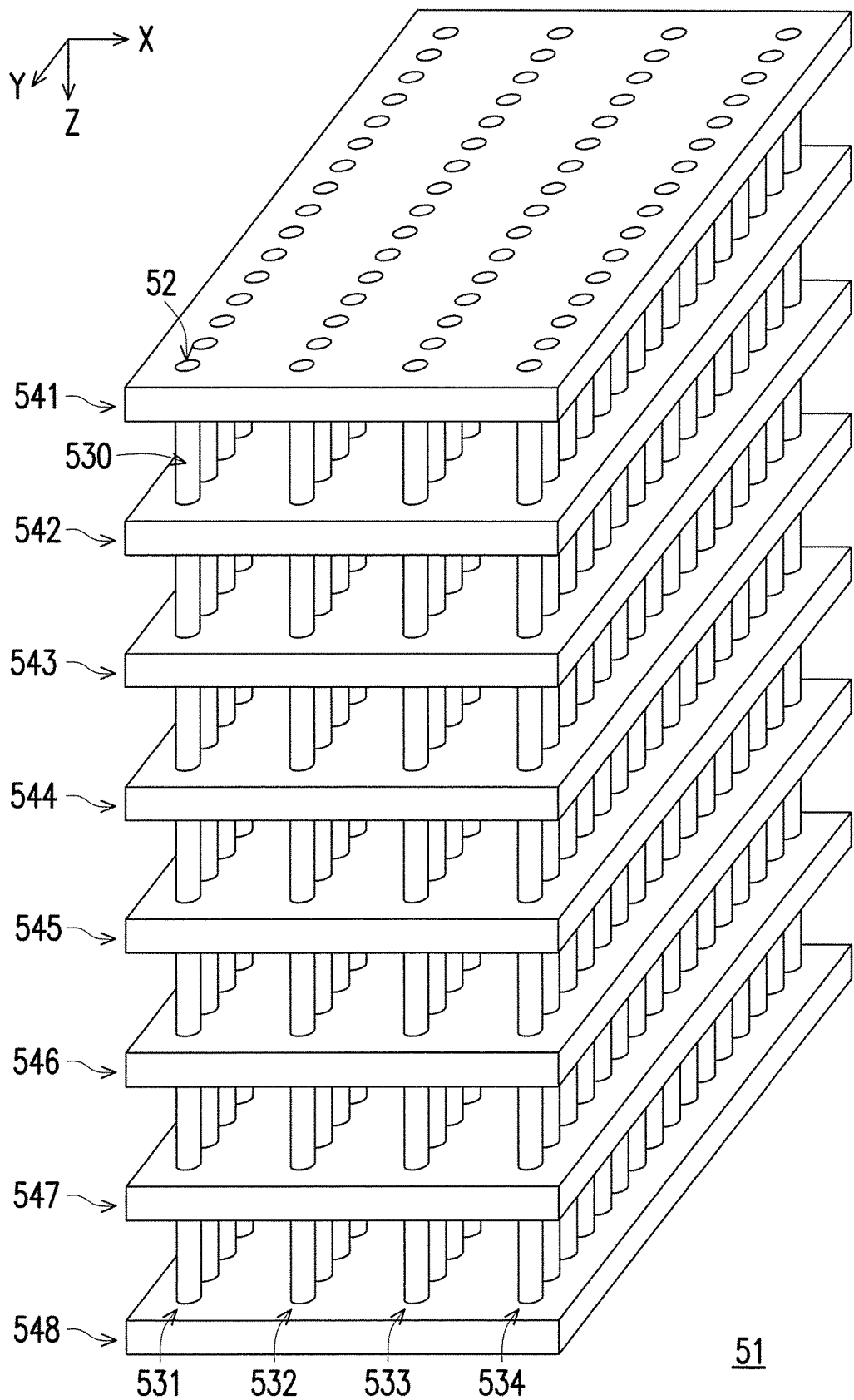
FIG. 5A is a schematic diagram illustrating a three-dimensional memory cell array according to an exemplary embodiment of the disclosure.

FIG. 5A is a schematic diagram illustrating a three-dimensional memory cell array according to an exemplary embodiment of the disclosure.

Referring to FIG. 5A, a memory cell array 51 includes a plurality of memory cells 52 for storing data, a plurality of bit line sets 531-534, and a plurality of word line layers 541-548. The bit line sets 531-534 are independent of each other (e.g., separate from each other) and are arranged along a first direction (e.g., an X-axis). Each bit line set of the bit line sets 531-534 includes a plurality of bit lines 530 independent of each other (e.g., separate from each other). The bit lines 530 included in each of the bit line sets are arranged along a second direction (e.g., a Y-axis) and extend toward a third direction (e.g., a Z-axis). The word line layers 541-548 are independent of each other (e.g., separate from each other) and are disposed by stacking along the third direction.

In the present exemplary embodiment, each word line layer of the word line layers 541-548 may also be regarded as a word line plane. Each of the memory cells 52 is disposed at each of intersections between each of the bit lines 530 in the bit line sets 531-534 and the word line layers 541-548. It is noted that the memory cell array 51 of FIG. 5A is just an example. In other unmentioned exemplary embodiments, a total number of the memory cells 52, a total number of the bit line sets 531-534, and a total number of the word line layers 541-548 may be changed. Moreover, in another exemplary embodiment, one bit line set may include more or fewer bit lines, and one word line layer may be passed by more or fewer bit line sets.

Figure 5B:
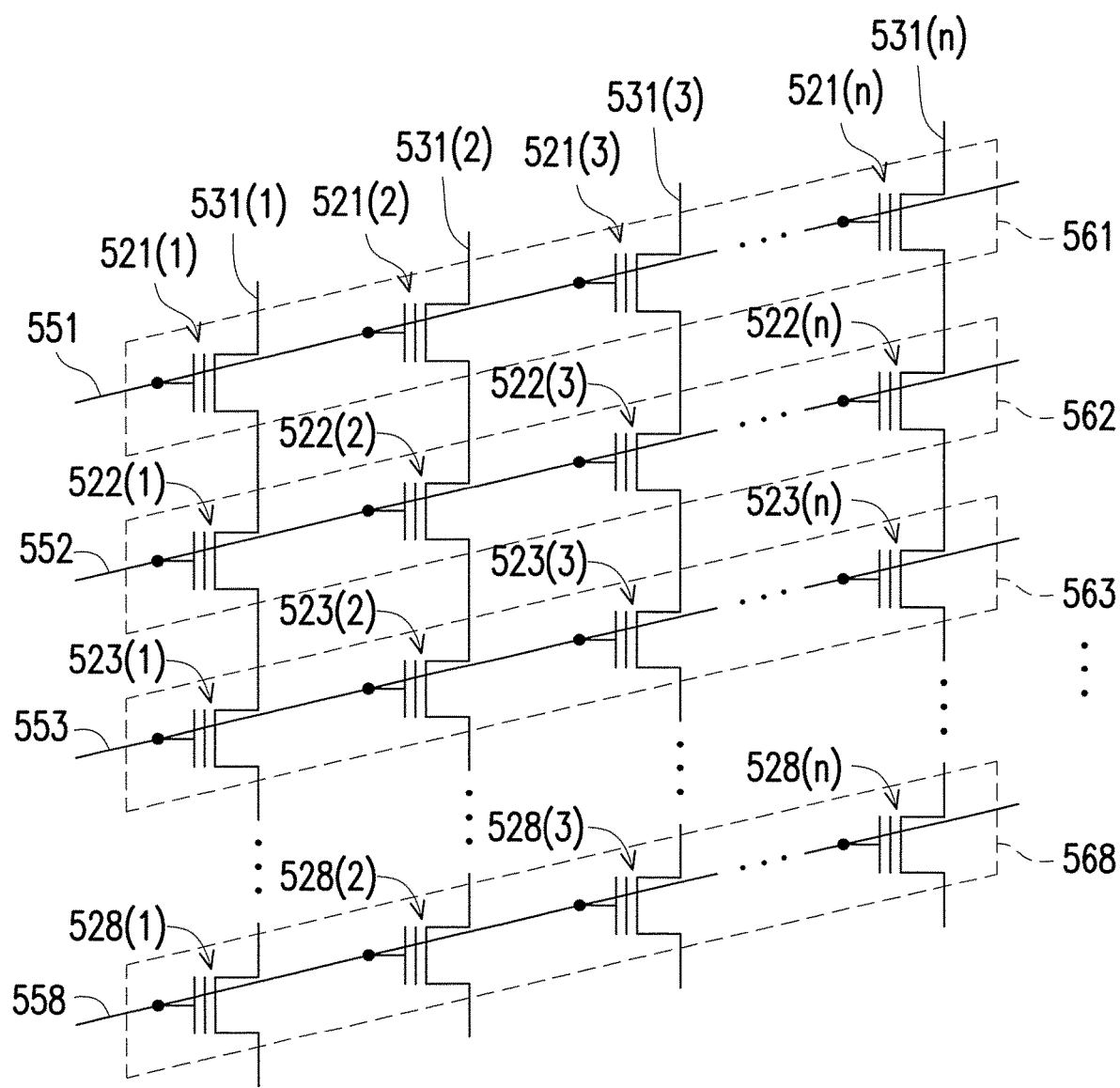
FIG. 5B is a schematic diagram illustrating an equivalent circuit of a three-dimensional memory cell array according to an exemplary embodiment of the disclosure.

FIG. 5B is a schematic diagram illustrating an equivalent circuit of a three-dimensional memory cell array according to an exemplary embodiment of the disclosure.

Referring to FIG. 5A and FIG. 5B, transistor units 521(1)-521(n) are located on the word line layer 541. Transistor units 522(1)-522(n) are located on the word line layer 542. Transistor units 523(1)-523(n) are located on the word line layer 543. Transistor units 528(1)-528(n) are located on the word line layer 548. One transistor unit is equivalent to one memory cell. The bit line set 531 includes bit lines 531(1)-531(n). The bit line 531(1) connects the transistor unit 521(1), the transistor unit 522(1), the transistor unit 523(1) . . . , and the transistor unit 528(1) in series. The bit line 531(2) connects the transistor unit 521(2), the transistor unit 522(2), the transistor unit 523(2) . . . , and the transistor unit 528(2) in series. The bit line 531(3) connects the transistor unit 521(3), the transistor unit 522(3), the transistor unit 523(3) . . . , and the transistor unit 528(3) in series. The bit line 531(n) connects the transistor unit 521(n), the transistor unit 522(n), the transistor unit 523(n) . . . , and the transistor unit 528(n) in series.

The word line 551 is located on the word line layer 541. The word line 552 is located on the word line layer 542. The word line 553 is located on the word line layer 543. The word line 558 is located on the word line layer 548. The word line 551 connects the transistor units 521(1)-521(n) in series. The word line 552 connects the transistor units 522(1)-522(n) in series. The word line 553 connects the transistor units 523(1)-523(n) in series. The word line 558 connects the transistor units 528(1)-528(n) in series. It is noted that FIG. 5B only illustrates part of components in each of the word line layers in FIG. 5A. The remaining unillustrated components may be analogously inferred.

In the present exemplary embodiment, a total number of the transistor units connected by the same word line in series is equal to a total number of the memory cells included in one physical unit. For example, the transistor units 521(1)-521(n) are included in a physical unit 561, the transistor units 522(1)-522(n) are included in a physical unit 562, the transistor units 523(1)-523(n) are included in a physical unit 563, and the transistor units 528(1)-528(n) are included in a physical unit 568. Taking the physical unit 561 as an example, when data stored in the physical unit 561 is to be read, storage states of the transistor units 521(1)-521(n) may be simultaneously read. Moreover, when data is to be stored to the physical unit 561, the transistor units 521(1)-521(n) may be simultaneously programmed. In an exemplary embodiment, a total number of the memory cells included in each physical unit of the physical units 561-568 is equal to a total number of the memory cells included in one physical programming unit.

Figure 6:
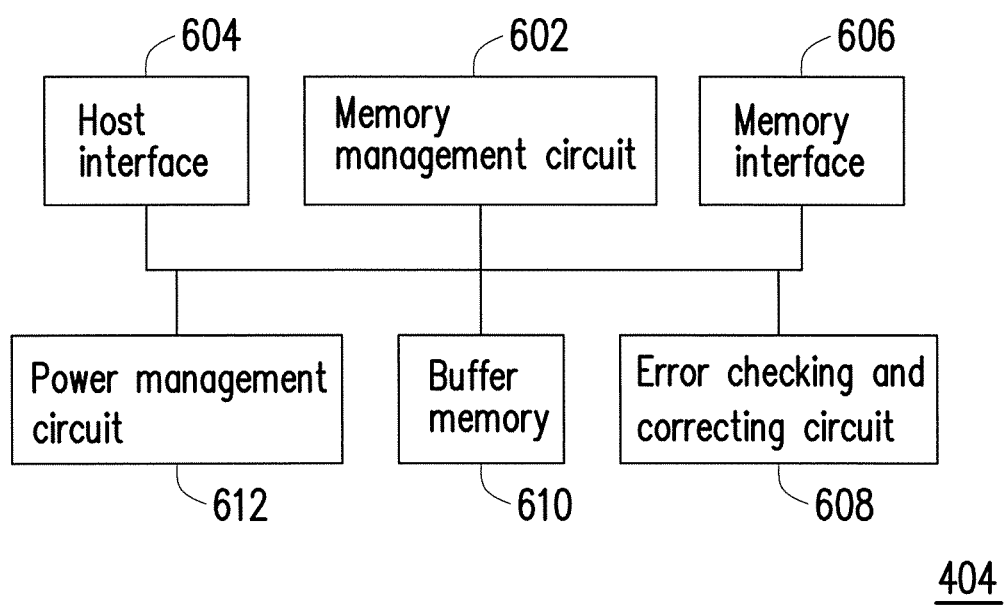
FIG. 6 is a schematic block diagram illustrating a memory control circuit unit according to an exemplary embodiment of the disclosure.

FIG. 6 is a schematic block diagram illustrating a memory control circuit unit according to an exemplary embodiment of the disclosure.

Referring to FIG. 6, the memory control circuit unit 404 includes a memory management circuit 602, a host interface 604, a memory interface 606, and an error checking and correcting circuit 608.

The memory management circuit 602 is configured to control overall operations of the memory control circuit unit 404. Specifically, the memory management circuit 602 has a plurality of control commands, and when the memory storage device 10 is operated, the control commands are executed to perform operations such as data writing, reading, and erasing. Hereinafter, the description of operations of the memory management circuit 602 is regarded as equivalent to describing operations of the memory control circuit unit 404.

In the present exemplary embodiment, the control commands of the memory management circuit 602 are implemented in a firmware form. For example, the memory management circuit 602 includes a microprocessor unit (not illustrated) and a read only memory (not illustrated), wherein the control commands are burnt in the read only memory. When the memory storage device 10 is operated, the control commands are executed by the microprocessor unit to perform operations of data writing, reading, erasing, etc.

In another exemplary embodiment, the control commands of the memory management circuit 602 may also be stored as program codes in a specific area (for example, a system area in a memory module exclusively used for storing system data) of the rewritable non-volatile memory module 406. In addition, the memory management circuit 602 includes a microprocessor unit (not illustrated), a read only memory (not illustrated), and a random access memory (not illustrated). More particularly, the read only memory has a boot code, which is executed by the microprocessor unit to load the control commands stored in the rewritable non-volatile memory module 406 to the random access memory of the memory management circuit 602 when the memory control circuit unit 404 is enabled. Afterwards, the control commands are run by the microprocessor unit to perform operations of data writing, reading, erasing, etc.

Furthermore, in another exemplary embodiment, the control commands of the memory management circuit 602 may also be implemented in a hardware form. For example, the memory management circuit 602 includes a microcontroller, a memory cell management circuit, a memory writing circuit, a memory reading circuit, a memory erasing circuit, and a data processing circuit. The memory cell management circuit, the memory writing circuit, the memory reading circuit, the memory erasing circuit, and the data processing circuit are coupled to the microcontroller. The memory cell management circuit is configured to manage the memory cells of the rewritable non-volatile memory module 406 or a group thereof. The memory writing circuit is configured to issue a write command sequence for the rewritable non-volatile memory module 406 to write data to the rewritable non-volatile memory module 406. The memory reading circuit is configured to issue a read command sequence for the rewritable non-volatile memory module 406 to read data from the rewritable non-volatile memory module 406. The memory erasing circuit is configured to issue an erase command sequence for the rewritable non-volatile memory module 406 to erase data from the rewritable non-volatile memory module 406. The data processing circuit is configured to process the data to be written to the rewritable non-volatile memory module 406 and the data read from the rewritable non-volatile memory module 406. Each of the write command sequence, the read command sequence, and the erase command sequence may include one or more program codes or command codes for instructing the rewritable non-volatile memory module 406 to perform the corresponding operations, such as data writing, reading, and erasing. In an exemplary embodiment, the memory management circuit 602 may further issue command sequences of other types for the rewritable non-volatile memory module 406 to instruct performing corresponding operations.

The host interface 604 is coupled to the memory management circuit 602 and is configured to receive and identify commands and data transmitted by the host system 11. In other words, the commands and data transmitted by the host system 11 are transmitted to the memory management circuit 602 via the host interface 604. In the present exemplary embodiment, the host interface 604 is compatible with the SATA standard. However, it is understood that the disclosure is not limited hereto, and the host interface 604 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable data transmission standards.

The memory interface 606 is coupled to the memory management circuit 602 and is configured to access the rewritable non-volatile memory module 406. In other words, data to be written to the rewritable non-volatile memory module 406 is converted into a format acceptable by the rewritable non-volatile memory module 406 through the memory interface 606. Specifically, if the memory management circuit 602 is to access the rewritable non-volatile memory module 406, the memory interface 606 transmits corresponding command sequences. For example, the command sequences may include the write command sequence for instructing writing data, the read command sequence for instructing reading data, the erase command sequence for instructing erasing data, and other corresponding command sequences for instructing performing various memory operations (e.g., changing a read voltage level, performing a garbage collection operation and so on). These command sequences are generated by the memory management circuit 602 and are transmitted to the rewritable non-volatile memory module 406 through the memory interface 606, for example. These command sequences may include one or more signals, or data transmitted on the bus. The signals or the data may include command codes or program codes. For example, in a read command sequence, information such as read identification codes and memory addresses is included.

The error checking and correcting circuit 608 is coupled to the memory management circuit 602 and is configured to perform an error checking and correcting operation to ensure the correctness of data. Specifically, when the memory management circuit 602 receives the write command from the host system 11, the error checking and correcting circuit 608 generates a corresponding error correcting code (ECC) and/or error detecting code (EDC) for data corresponding to the write command, and the memory management circuit 602 writes the data corresponding to the write command and the corresponding error correcting code and/or error detecting code to the rewritable non-volatile memory module 406. Afterwards, when reading the data from the rewritable non-volatile memory module 406, the memory management circuit 602 simultaneously reads the error correcting code and/or the error detecting code corresponding to the data, and the error checking and correcting circuit 608 performs the error checking and correcting operation on the read data according to the error correcting code and/or the error detecting code.

In the present exemplary embodiment, the error checking and correcting circuit 608 uses a low-density parity-check (LDPC) code. However, in another exemplary embodiment, the error checking and correcting circuit 608 may also use a BCH code, a convolutional code, a turbo code, etc.

In an exemplary embodiment, the memory control circuit unit 404 further includes a buffer memory 610 and a power management circuit 612. The buffer memory 610 is coupled to the memory management circuit 602 and is configured to temporarily store data and commands from the host system 11 or data from the rewritable non-volatile memory module 406. The power management circuit 612 is coupled to the memory management circuit 602 and is configured to control a power of the memory storage device 10.

In the present exemplary embodiment, the memory management circuit 602 configures logical units to map to the physical units in the rewritable non-volatile memory module 406. In the present exemplary embodiment, a physical unit refers to a physical programming unit, and a logical unit may refer to a logical address, a logical programming unit, or a logical erasing unit or consist of a plurality of consecutive or non-consecutive logical addresses. In addition, a logical unit may be mapped to one or more physical units. For example, the memory management circuit 602 may record a mapping relation (also known as a logical-physical mapping relation) between the logical units and the physical units into at least one logical-physical mapping table. When the host system 11 is to read the data from the memory storage device 10 or write the data to the memory storage device 10, the memory management circuit 602 may access the data in the memory storage device 10 according to the logical-physical mapping table.

It is noted that in the following description, some terms may be replaced with corresponding abbreviations for ease of reading (see Table 1).

TABLE 1

| | |
|---|---|
| rewritable non-volatile memory module | RNVM module |
| physical unit | PU |
| memory management circuit | MMC |
| error checking and correcting circuit | ECCC |
| read voltage level | RVL |

In the low-density parity-check code, a valid codeword is defined by using a parity-check matrix. Hereinafter, a parity-check matrix is marked as matrix H, and a codeword is marked as CW. According to an equation (1) below, if a result calculated by multiplying the parity-check matrix H by the codeword CW is a zero vector, it indicates that the codeword CW is a valid codeword. Therein, an operator ⊗ represents a mod-2 matrix multiplication. In other words, a null space of the matrix H includes all valid codewords. However, the disclosure does not limit the content of the codeword CW. For example, the codeword CW may also include an error correcting code or an error detecting code generated by using any algorithm.

$$H \otimes CW^T = 0 \quad (1)$$

In the equation (1), a dimension of the matrix H is k-by-n, and a dimension of the codeword CW is 1-by-n, where k and n are both positive integers. The codeword CW includes message bits and parity bits. In other words, the codeword CW may be represented by [M P], where a vector M is constituted by the message bits, and a vector P is constituted by the parity bits. A dimension of the vector M is 1-by-(n–k), and a dimension of the vector P is 1-by-k. Hereinafter, the message bits and the parity bits are collectively referred to as data bits. In other words, the codeword CW includes n data bits, where a length of the message bits is (n–k) bits, and a length of the parity bits is k bits. Accordingly, a code rate of the codeword CW is (n–k)/n.

Generally, a generation matrix (hereinafter marked as G) is used during encoding, so that an equation (2) below may be satisfied by any vector M, where a dimension of the generation matrix G is (n–k)-by-n.

$$M \otimes G = [M\ P] = CW \quad (2)$$

The codeword CW generated by the equation (2) is a valid codeword. Therefore, the equation (2) may be substituted into the equation (1) to obtain an equation (3) below.

$$H \otimes G^T \otimes M^T = 0 \quad (3)$$

Since the vector M may be any vector, an equation (4) below is definitely satisfied. In other words, after the parity-check matrix H is determined, the corresponding generation matrix G may also be determined.

$$H \otimes G^T = 0 \quad (4)$$

When a codeword CW is decoded, a parity-check operation is first performed on the data bits in the codeword. For example, the parity-check matrix H may be multiplied by the codeword CW to generate a vector (hereinafter marked as S, as shown in an equation (5) below). If the vector S is a zero vector, the codeword CW may be directly output. If the vector S is not a zero vector, it indicates that the codeword CW is not a valid codeword.

$$H \otimes CW^T = S \quad (5)$$

In the equation (5), a dimension of the vector S is k-by-1, where each element is also referred to as a syndrome. If the codeword CW is not a valid codeword, the ECCC 608 performs a decoding procedure (also referred to as a decoding operation) to correct an error (i.e., an error bit) in the codeword CW.

Figure 7:
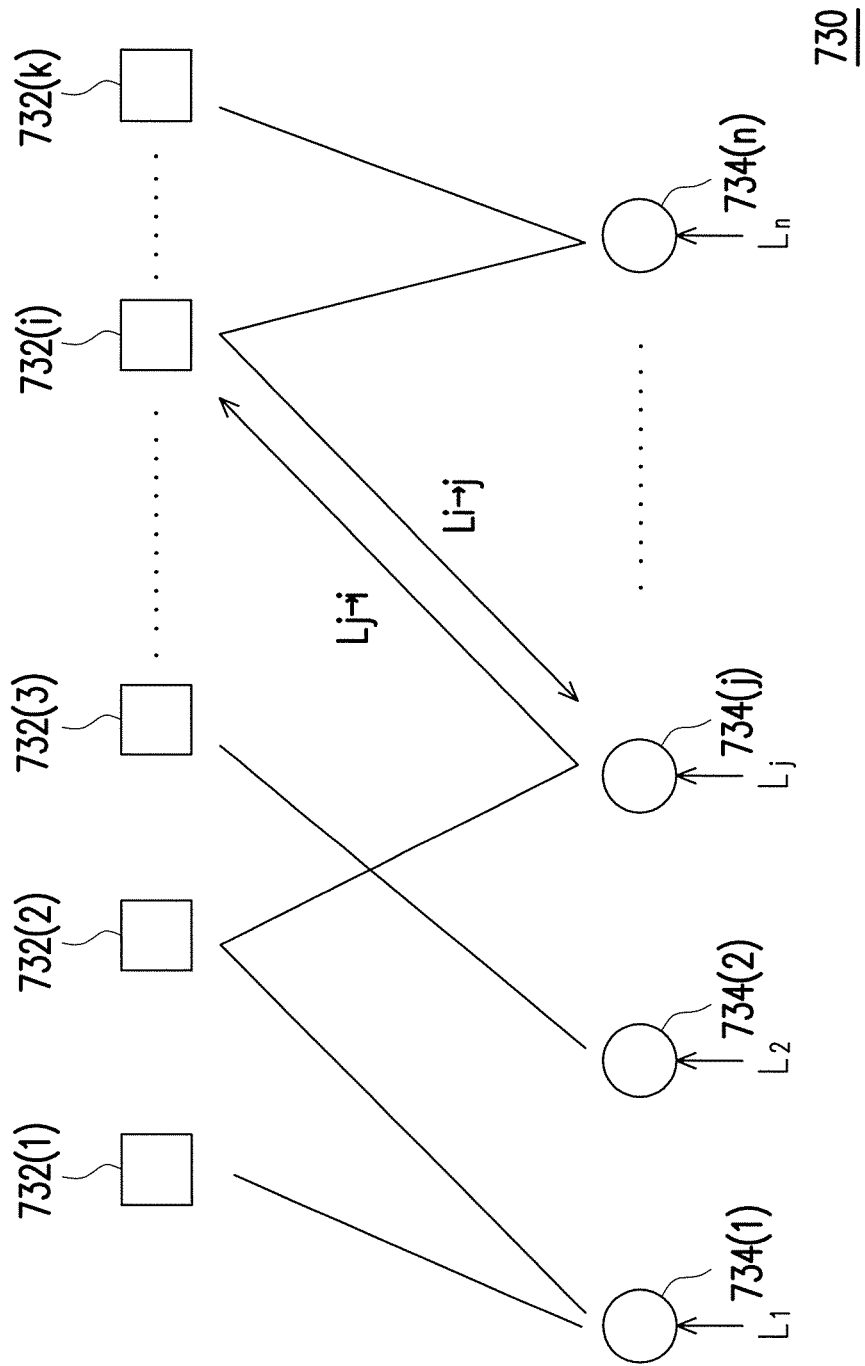
FIG. 7 is a schematic diagram illustrating a parity-check matrix according to an exemplary embodiment of the disclosure.

FIG. 7 is a schematic diagram illustrating a parity-check matrix according to an exemplary embodiment of the disclosure. Referring to FIG. 7, generally, the parity-check matrix H may be represented by a bipartite graph 730, which includes parity nodes 732(1)-732(k) and message nodes 734(1)-734(n). Each of the parity nodes 732(1)-732(k) corresponds to a syndrome, and each of the message nodes 734(1)-734(n) corresponds to a data bit. A correspondence relation between the data bits and the syndromes (i.e., connections between the message nodes 734(1)-734(n) and the parity nodes 732(1)-732(k)) is generated according to the parity-check matrix H. Specifically, if an element in an $i^{th}$ row and $j^{th}$ column in the parity-check matrix H is 1, then the $i^{th}$ parity node 732(i) is connected to the $j^{th}$ message node 734(j), wherein i and j are positive integers.

When the MMC 602 reads n data bits (forming a codeword) from the RNVM module 406, the MMC 602 also obtains reliability information (also referred to as channel reliability information) of each of the data bits. The reliability information is used to represent a probability (or referred to as a confidence) of decoding the corresponding data bit into bit "1" or "0". In the bipartite graph 730, the message nodes 734(1)-734(n) also receive the corresponding reliability information. For example, the message node 732(1) receives reliability information $L_1$ of a $1^{st}$ data bit, and the message node 732(j) receives reliability information $L_j$ of a $j^{th}$ data bit.

The ECCC 608 performs the decoding operation according to a structure of the bipartite graph 730 and the reliability information $L_1$-$L_n$. For example, the decoding operation includes an iterative decoding. In the iterative decoding, the message nodes 734(1)-734(n) calculate the reliability information for the parity nodes 732(1)-732(k), and the parity nodes 732(1)-732(k) also calculate the reliability information for the message nodes 734(1)-734(n). The reliability information is transmitted along edges in the bipartite graph 730. For example, the parity node 732(i) transmits reliability information $L_{i \to j}$ to the message node 734(j), and the message node 734(j) transmits reliability information $L_{j \to i}$ to the parity node 732(i). The reliability information is used to represent a probability (i.e., a confidence) that a node believes a data bit would be decoded into "1" or "0". For example, the reliability information $L_{j \to i}$ represents a confidence (which may be positive or negative) that the message node 734(j) believes the $j^{th}$ data bit would be decoded into "1" or "0", and the reliability information $L_{i \to j}$ represents a confidence that the parity node 732(i) believes the $j^{th}$ data bit would be decoded into "1" or "0". Moreover, the message nodes 734(1)-734(n) and the parity nodes 732(1)-732(k) calculate the output reliability information according to the input reliability information, which is similar to calculating a conditional probability of decoding a data bit into "1" or "0". Therefore, the foregoing process of transmitting the reliability information is also referred to as belief propagation.

Based on different algorithms, the message nodes 734(1)-734(n) and/or the parity nodes 732(1)-732(k) calculate reliability information of different forms. For example, the ECCC 608 may adopt algorithms such as a sum-product algorithm, a min-sum algorithm, or a bit-flipping algorithm, which is not limited in the disclosure.

In each iteration of the iterative decoding, the message nodes 734(1)-734(n) transmit the reliability information to the parity nodes 732(1)-732(k), and the parity nodes 732(1)-732(k) also transmit the reliability information to the message nodes 734(1)-734(n). After each iteration, the message nodes 734(1)-734(n) calculate whether each of the data bits should be decoded into the bit "1" or "0" according to the current reliability information. After a parity-check procedure is performed on the calculated data bits (e.g., by multiplying the codeword formed by the data bits and the parity-check matrix), it can be determined whether the codeword is a valid codeword. If the generated codeword is a valid codeword, it means that the decoding is successful and the iterative decoding will stop. However, if the generated codeword is not a valid codeword, a next iteration will be performed. If an iteration count of the iterative decoding reaches a predetermined value, it means that the decoding fails and the iterative decoding will also stop.

In the present exemplary embodiment, the reliability information includes a log likelihood ratio (LLR). For example, the reliability information $L_1$-$L_n$, $L_{i \to j}$, and $L_{j \to i}$ in FIG. 7 are respectively a log likelihood ratio. Generally, the greater an absolute value of a log likelihood ratio (which may be positive or negative) of a data bit is, the higher the reliability of the data bit is, such that there is a higher probability for a current bit value of the data bit to be believed to be correct. Conversely, the smaller an absolute value of a log likelihood ratio of a data bit is, the lower the reliability of the data bit is, such that there is a higher probability for the current bit value of the data bit to be believed to be erroneous and be corrected in the current iterative decoding. In an exemplary embodiment, the reliability information (e.g., the log likelihood ratio) used in the iterative decoding is obtained by looking up a table. However, in another exemplary embodiment, the reliability information used in the iterative decoding may also be generated by dynamically calculating according to a specific algorithm during the iterative decoding.

It is noted that if the RNVM module 406 includes the three-dimensional memory cell array (as shown in FIG. 5A and FIG. 5B), in the plurality of memory cells (or transistor units) connected in series by the same bit line, electrical charges in these memory cells may be attracted by adjacent memory cells due to an overly short distance between the memory cells and may be lost. For example, in FIG. 5B, electrons in a transistor unit 522(i) may be attracted by the transistor unit 521(i) and/or the transistor unit 523(i) and move toward the transistor unit 521(i) and/or the transistor unit 523(i), such that a threshold voltage of the transistor unit 522(i) may be lowered, and threshold voltages of the transistor unit 521(i) and/or the transistor unit 523(i) may rise, wherein 0<i<n+1, and i is an integer. If the foregoing situation occurs on many of the transistor units in the RNVM module 406, a threshold voltage distribution of the memory cells in the RNVM module 406 may be greatly shifted, which inhibits the data read from the memory cells from being successfully decoded.

In the present exemplary embodiment, according to a read command from the host system 11, the MMC 602 issues a read command sequence. For example, the read command sequence instructs reading data (also referred to as first data) stored in one or more memory cells in one or more PUs. According to the read command sequence, the RNVM module 406 uses at least one RVL to read the memory cells and transmit the first data in return, wherein the first data includes a plurality of bits (i.e., data bits). For ease of illustration, hereinafter, one of the bits in the first data is referred to as a first bit, and the first bit is obtained through reading a specific memory cell (also referred to as a first memory cell). The MMC 602 obtains a storage state of at least one memory cell (also referred to as a second memory cell) different from the first memory cell in the RNVM module 406. For example, if the first memory cell belongs to a PU (also referred to as a first PU), then the second memory cell belongs to one or more PUs (hereinafter also referred to as a second PU) different from the first PU. For example, in FIG. 5B, if the first PU is the PU 562, then the second PU may be the PU 561 and/or the PU 563.

The MMC 602 obtains reliability information (also referred to as first reliability information) corresponding to the first bit according to the storage state of the second memory cell. It is noted that the first reliability information corresponding to the first bit is different from default reliability information corresponding to the first bit. Then, the ECCC 608 decodes the first data according to the first reliability information. For example, the first reliability information may be included in the reliability information $L_1$-$L_n$ in FIG. 7 and be input to the ECCC 608.

Figure 8:
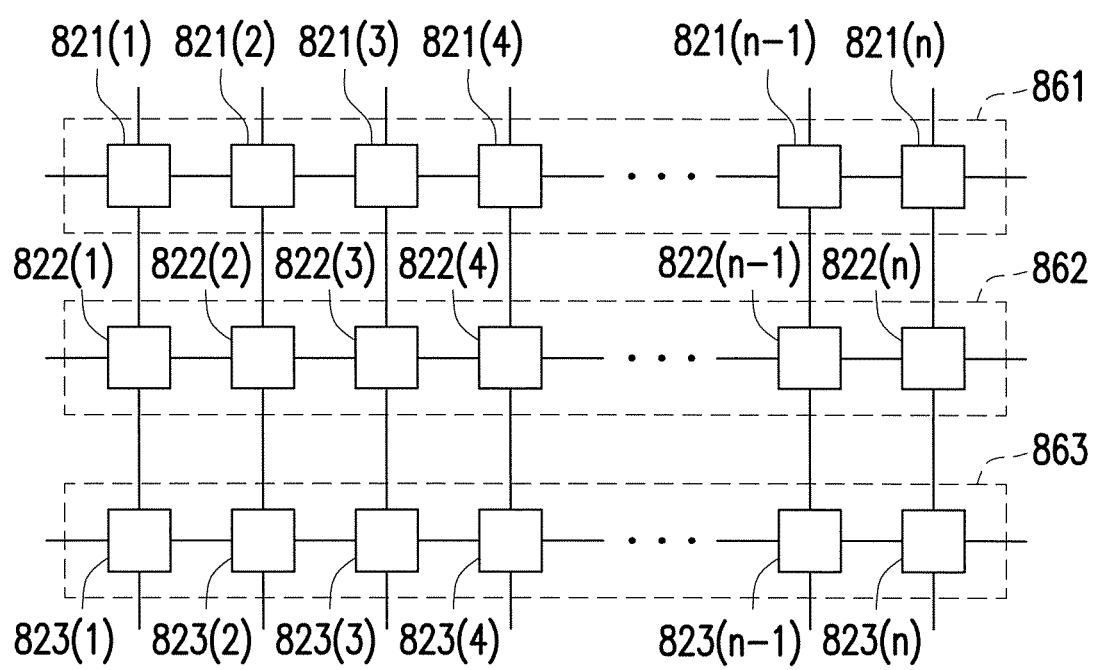
FIG. 8 is a schematic diagram illustrating a memory cell array according to an exemplary embodiment of the disclosure.
Figure 9:
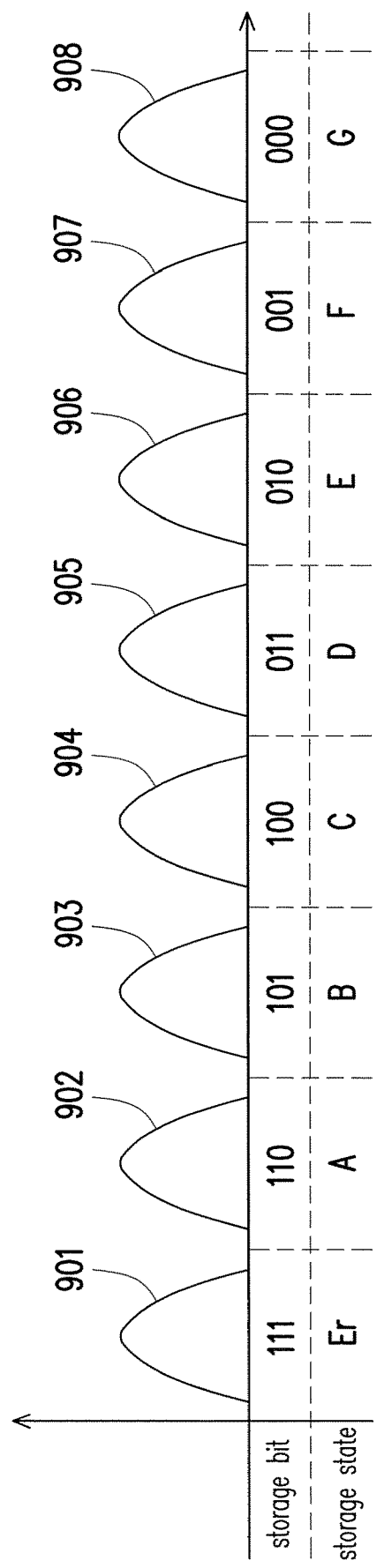
FIG. 9 is a schematic diagram illustrating storage states of memory cells according to an exemplary embodiment of the disclosure.

FIG. 8 is a schematic diagram illustrating a memory cell array according to an exemplary embodiment of the disclosure. FIG. 9 is a schematic diagram illustrating storage states of memory cells according to an exemplary embodiment of the disclosure.

Referring to FIG. 8 and FIG. 9, a PU 861 includes memory cells 821(1)-821(n), a PU 862 includes memory cells 822(1)-822(n), and a PU 863 includes memory cells 823(1)-823(n). For example, the memory cells 821(1)-821(n) are used to represent the transistor units 521(1)-521(n) in FIG. 5B; the memory cells 822(1)-822(n) are used to represent the transistor units 522(1)-522(n) in FIG. 5B; and the memory cells 823(1)-823(n) are used to represent the transistor units 523(1)-523(n) in FIG. 5B. Moreover, it is assumed that the memory cells 822(1)-822(n) are the first memory cells. In an exemplary embodiment, the memory cell 822(i) may be seen as adjacent to the memory cells 821(i) and 823(i), wherein 0<i<n+1.

Taking the TLC NAND flash memory as an example, the storage state of each of the memory cells 821(1)-821(n), the memory cells 822(1)-822(n), and the memory cells 823(1)-823(n) may be one of states 901-908. For example, if the storage state of one specific memory cell is the state 901, it is possible that the memory cell is currently used to store bits "111", and the storage state of the memory cell may be labeled as "Er". If the storage state of one specific memory cell is the state 902, it is possible that the memory cell is currently used to store bits "110", and the storage state of the memory cell may be labeled as "A". If the storage state of one specific memory cell is the state 903, it is possible that the memory cell is currently used to store bits "101", and the storage state of the memory cell may be labeled as "B". If the storage state of one specific memory cell is the state 904, it is possible that the memory cell is currently used to store bits "100", and the storage state of the memory cell may be labeled as "C". If the storage state of one specific memory cell is the state 905, it is possible that the memory cell is currently used to store bits "011", and the storage state of the memory cell may be presented as "D". If the storage state of one specific memory cell is the state 906, it is possible that the memory cell is currently used to store bits "010", and the storage state of the memory cell may be presented as "E". If the storage state of one specific memory cell is the state 907, it is possible that the memory cell is currently used to store bits "001", and the storage state of the memory cell may be presented as "F". If the storage state of one specific memory cell is the state 908, it is possible that the memory cell is currently used to store bits "000", and the storage state of the memory cell may be presented as "G". Moreover, if the RNVM module 406 is an MLC NAND flash memory or a flash memory of another type, the storage states of each of the memory cells may be four states or have more or fewer states, which is not limited in the disclosure.

In an exemplary embodiment, it is assumed that the first data includes data obtained through reading the memory cells 822(1)-822(n), and the first bit in the first data is bit data obtained through reading the memory cell 822(1). The MMC 602 determines first reliability information of the memory cell 822(1) according to the storage states of the memory cell 821(1) and/or the memory cell 823(1). For example, in an exemplary embodiment, the MMC 602 determines the first reliability information of the memory cell 822(1) according to the storage states of the memory cell 821(1) and/or the memory cell 823(1) and the threshold voltage of the memory cell 822(1). It is noted that in an exemplary embodiment, the MMC 602 may actually measure the threshold voltage of the memory cell 822(1). Alternatively, in an exemplary embodiment, the MMC 602 may also obtain information relevant to the threshold voltage of the memory cell 822(1) by using other technical means. The obtained information (e.g., soft bit information of the memory cell 822(1)) may be used to represent the threshold voltage of the memory cell 822(1). In an exemplary embodiment, the memory cell 822(1) is regarded as the first memory cell, and at least one of the memory cells 821(1) and 823(1) is regarded as the second memory cell.

Figure 10:
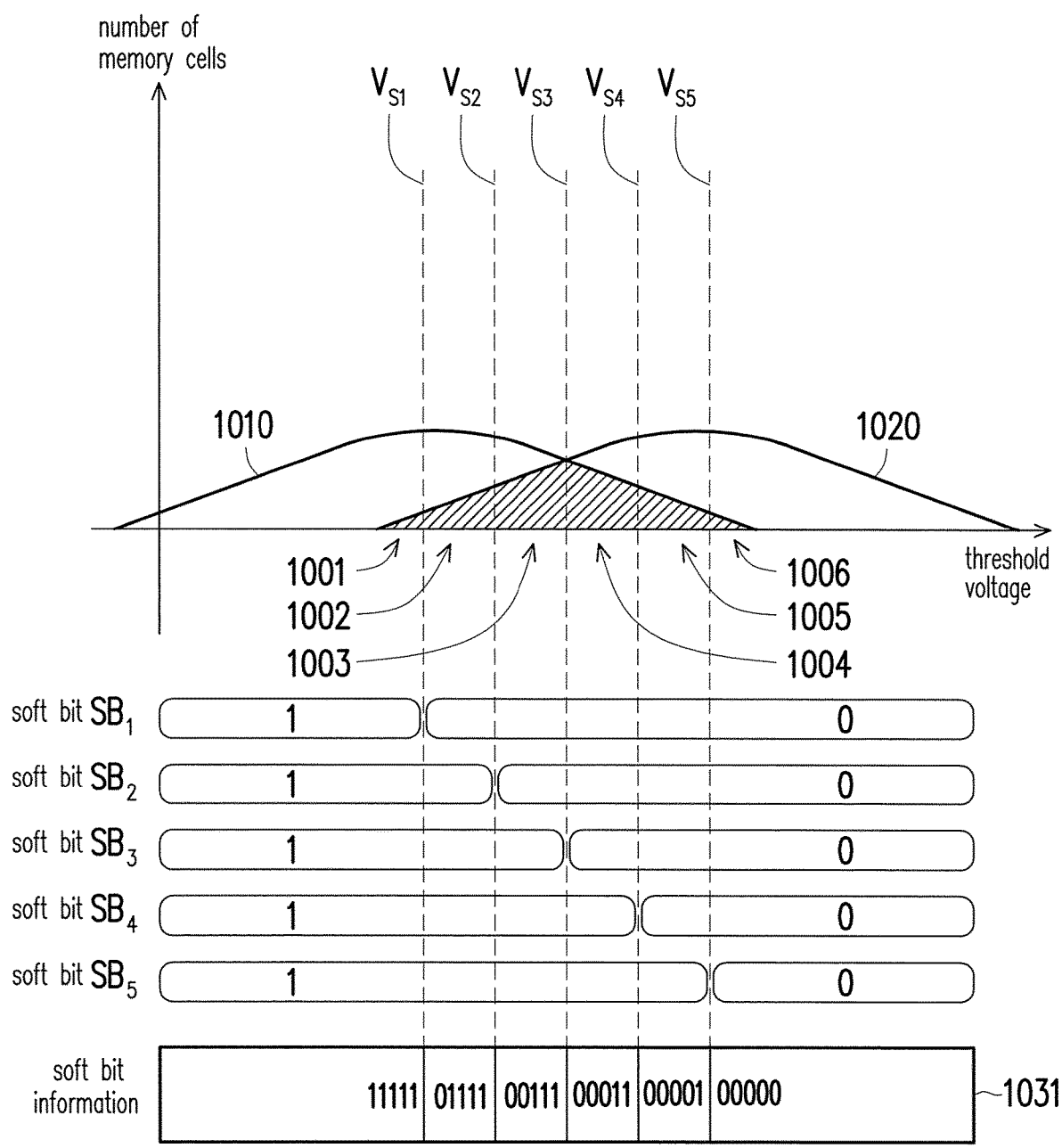
FIG. 10 is a schematic diagram illustrating a threshold voltage distribution of first memory cells according to an exemplary embodiment of the disclosure.

FIG. 10 is a schematic diagram illustrating a threshold voltage distribution of first memory cells according to an exemplary embodiment of the disclosure. Referring to FIG. 8 and FIG. 10, it is assumed that states 1010 and 1020 are part of the threshold voltage distribution of the memory cells 822(1)-822(n). The states 1010 and 1020 cover a plurality of voltage ranges 1001-1006. The voltage ranges 1001-1006 are distinguished by RVLs $V_{S1}$-$V_{S5}$ (also referred to as soft decision RVLs).

In an exemplary embodiment, the MMC 602 identifies to which voltage range of the voltage ranges 1001-1006 the threshold voltage of the memory cell 822(1) belongs. For example, the MMC 602 may issue a read command sequence (also referred to as a soft decision read command sequence) to the RNVM module 406. According to the soft decision read command sequence, the RNVM module 406 uses the RVLs $V_{S1}$-$V_{S5}$ to read the memory cells 822(1)-822(n) and transmits the obtained information (e.g., soft bit information 1031) to the MMC 602. For example, the soft bit information 1031 includes soft bits $SB_1$-$SB_5$ obtained by reading one specific memory cell of the memory cells 822(1)-822(n) by using the RVLs $V_{S1}$-$V_{S5}$. For example, the soft bit information 1031 includes the soft bits $SB_1$-$SB_5$ obtained by reading the memory cell 822(1) by using the RVLs $V_{S1}$-$V_{S5}$ and the soft bits $SB_1$-$SB_5$ obtained by reading the memory cell 822(2) by using the RVLs $V_{S1}$-$V_{S5}$, and so on. Moreover, in an exemplary embodiment, before transmitting the soft bit information to the MMC 602, the RNVM module 406 performs a logical operation on at least part of the soft bits corresponding to the same memory cell to reduce a total number of the soft bits to be transmitted.

According to the soft bit information 1031, the MMC 602 identifies to which of the voltage ranges 1001-1006 the threshold voltage of the memory cell 822(1) belongs. For example, if the soft bit information 1031 corresponding to the memory cell 822(1) is "11111", the MMC 602 identifies that the threshold voltage of the memory cell 822(1) belongs to the voltage range 1001. If the soft bit information 1031 corresponding to the memory cell 822(1) is "01111", the MMC 602 identifies that the threshold voltage of the memory cell 822(1) belongs to the voltage range 1002. If the soft bit information 1031 corresponding to the memory cell 822(1) is "00111", the MMC 602 identifies that the threshold voltage of the memory cell 822(1) belongs to the voltage range 1003. If the soft bit information 1031 corresponding to the memory cell 822(1) is "00011", the MMC 602 identifies that the threshold voltage of the memory cell 822(1) belongs to the voltage range 1004. If the soft bit information 1031 corresponding to the memory cell 822(1) is "00001", the MMC 602 identifies that the threshold voltage of the memory cell 822(1) belongs to the voltage range 1005. Alternatively, if the soft bit information 1031 corresponding to the memory cell 822(1) is "00000", the MMC 602 identifies that the threshold voltage of the memory cell 822(1) belongs to the voltage range 1006.

It is noted that in an exemplary embodiment of FIG. 10, one of the RVLs $V_{S1}$-$V_{S5}$ is set as a sign RVL. The sign RVL is used to determine a bit value of the data bit. For example, if the RVL $V_{S3}$ is the sign RVL, a bit value of one data bit (e.g., the first bit) read from the memory cell 822(1) by using the RVL $V_{S3}$ will be identical to a bit value of the soft bit $SB_3$ read from the memory cell 822(1).

After obtaining the soft bit information 1031 corresponding to the memory cell 822(1), the MMC 602 may determine the first reliability information of the memory cell 822(1) according to the storage states of the memory cell 821(1) and/or the memory cell 823(1) and the voltage range (also referred to as a first voltage range) to which the threshold voltage of the memory cell 822(1) belongs. For example, in an exemplary embodiment, the MMC 602 obtains the reliability information corresponding to the first voltage range by looking up a lookup table (also referred to as a first lookup table) according to the soft bit information 1031 corresponding to the memory cell 822(1), wherein the reliability information corresponding to the first voltage range is regarded as the default reliability information corresponding to the first bit.

FIG. 11 is a schematic diagram illustrating a first lookup table according to an exemplary embodiment of the disclosure. FIG. 12 is a schematic diagram illustrating a second lookup table according to an exemplary embodiment of the disclosure.

Referring to FIG. 8, FIG. 10, and FIG. 11, a lookup table 1100 records the voltage ranges 1001-1006 and the corresponding default reliability information. For example, the voltage ranges 1001-1006 respectively correspond to default reliability information "−12", "−8", "−2", "+2", "+8", and "+12". It is noted that in the exemplary embodiment of FIG. 11, the log likelihood ratio is used to represent the reliability information, and the corresponding log likelihood ratio is gradually increased according a small-to-great order of the threshold voltages covered by the voltage ranges 1001-1006. However, in another exemplary embodiment, the reliability information may also be represented by information of another type, and/or the corresponding log likelihood ratio may be gradually decreased according the small-to-great order of the threshold voltages covered by the voltage ranges 1001-1006, which is not limited in the disclosure.

According to the lookup table 1100, if the threshold voltage of the memory cell 822(1) belongs to the voltage range 1002 (i.e., the soft bit information 1031 corresponding to the memory cell 822(1) is "01111"), then the MMC 602 determines that the default reliability information corresponding to the first bit is "−8". Then, the MMC 602 determines the first reliability information corresponding to the first bit according to the storage states of the memory cell 821(1) and/or the memory cell 823(1) and the default reliability information corresponding to the first bit. For example, according to the storage states of the memory cell 821(1) and/or the memory cell 823(1), the MMC 602 may look up another lookup table (also referred to as a second lookup table) and subtracts an adjustment value (also referred to as a first adjustment value) from or adds an adjustment value (also referred to as a second adjustment value) to the default reliability information corresponding to the first bit according to a lookup result, so as to obtain the first reliability information corresponding to the first bit.

Referring to FIG. 8, FIG. 9, FIG. 11, and FIG. 12, according to a lookup table 1200, if the storage state of the adjacent memory cell is a default state (also referred to as a first state) (e.g., the state Er, A, B, or C in FIG. 9), the adjustment value of the reliability information may be determined as −Δ, wherein Δ is also referred to as a reliability information adjustment value and Δ is a positive integer. If the storage state of the adjacent memory cell is another default state (also referred to as a second state) (e.g., the state D, E, F, or G in FIG. 9), the adjustment value of the reliability information may be determined as +Δ. It is noted that the adjacent memory cell mentioned in FIG. 12 refer to the second memory cell adjacent to the first memory cell. For example, if the first memory cell is the memory cell 822(1), the adjacent memory cell mentioned in FIG. 12 is at least one of the memory cells 821(1) and 823(1). In an exemplary embodiment, if (only) the storage state of the memory cell 821(1) is considered, when the storage state of the memory cell 821(1) is the first state, A is subtracted from the default reliability information (e.g., "−8") corresponding to the first bit to obtain the first reliability information (e.g., "−(8+Δ)") corresponding to the first bit. Alternatively, when the storage state of the memory cell 821(1) is the second state, A is added to the default reliability information (e.g., "−8") corresponding to the first bit to obtain the first reliability information (e.g., "−8+Δ") corresponding to the first bit. Accordingly, the reliability information corresponding to the first bit can be adjusted according to potential electron loss or electron gain of the memory cell 821(1) to thereby enhance a success rate of subsequent decoding of the first data. Moreover, the storage state of the memory cell 821(1) may also be replaced by the storage state of the memory cell 823(1), which is not repeatedly described here.

In an exemplary embodiment, the first reliability information corresponding to the first bit may also be determined according to the storage states of a plurality of adjacent memory cells. For example, in an exemplary embodiment, the corresponding reliability information adjustment value is determined according to the respective storage states of the memory cells 821(1) and 823(1) (e.g., both being the first state, one being the first state and the other being the second state, or both being the second state). Alternatively, in an exemplary embodiment, the corresponding reliability information adjustment value may be determined more specifically according to a plurality of combinations of the storage states of the memory cells 821(1) and 823(1) (e.g., respectively being "Er" and "A", "Er" and "B", or "B" and "G"), depending on the needs in practice. In addition, it is noted that in the exemplary embodiment of FIG. 12, as an example, the first adjustment value and the second adjustment value are both Δ. However, in another exemplary embodiment, the first adjustment value may also be different from the second adjustment value.

In an exemplary embodiment, if the default reliability information corresponding to the first bit is known, the MMC 602 may also (directly) determine the first reliability information corresponding to the first bit according to the storage state of the second memory cell and the default reliability information corresponding to the first bit, and the foregoing operation of determining the first reliability information corresponding to the first bit according to the threshold voltage of the first memory cell can be omitted. Moreover, the recited content and format of the first lookup table and the second lookup table above are merely examples. In other unmentioned embodiments, the recited content and format of the first lookup table and the second lookup table may both be adjusted according to the needs in practice and are not limited in the disclosure.

In an exemplary embodiment, before the first data is decoded according to the first reliability information corresponding to the first bit, the ECCC 608 decodes the first data according to the default reliability information corresponding to the first bit, wherein the default reliability information corresponding to the first bit is obtained by the operation described above or other methods, which will not be repeatedly described here. If the decoding of the first data according to the default reliability information corresponding to the first bit fails, the MMC 602 determines the first reliability information corresponding to the first bit based on the storage state of the second memory cell and the default reliability information corresponding to the first bit. For example, the MMC 602 adjusts the default reliability information corresponding to the first bit according to the storage state of the second memory cell to obtain the first reliability information corresponding to the first bit. Relevant adjustment operations of the reliability information have all been described above and will not be repeatedly described here. Then, the ECCC 608 may decode the first data again according to the first reliability information corresponding to the first bit.

Referring to FIG. 8 and FIG. 10, in an exemplary embodiment, it is assumed that the first data includes a bit (i.e., the first bit) read from the memory cell 822(1) and a bit (also referred to as a second bit) read from the memory cell 822(2), wherein the memory cell 822(2) is also referred to as a third memory cell, and the threshold voltages of the memory cells 822(1) and 822(2) both belong to the voltage range 1002. In this exemplary embodiment, the MMC 602 also obtains new reliability information (also referred to as second reliability information) corresponding to the second bit according to the foregoing operation of determining the first reliability information corresponding to the first bit. For example, the MMC 602 looks up the second lookup table according to the storage states of the memory cell 821(2) and/or the memory cell 823(2) and determines the second reliability information corresponding to the second bit according to a lookup result. Reference may be made to the descriptions in the foregoing exemplary embodiments for the operation of determining the second reliability information corresponding to the second bit, which will not be repeatedly described here.

It is noted that in an exemplary embodiment, the threshold voltages of the memory cells 822(1) and 822(2) both belong to the voltage range 1002. Therefore, according to the lookup table 1100 of FIG. 11, the default reliability information corresponding to the memory cells 822(1) and 822(2) is both "−8". However, the first reliability information corresponding to the first bit is different from the second reliability information corresponding to the second bit. For example, if the storage states of the memory cells 821(1) and 823(1) are both the first state, the first reliability information corresponding to the first bit is determined to be "−(8+Δ)", wherein "−(8+Δ)" is smaller than "−8". Meanwhile, if the storage states of the memory cells 821(2) and 823(2) are both the second state, the second reliability information corresponding to the second bit is determined to be "−8+Δ", wherein "−8+Δ" is greater than "−8". Then, the ECCC 608 decodes the first data according to the first reliability information corresponding to the first bit and the second reliability information corresponding to the second bit.

Referring to FIG. 8, FIG. 10, and FIG. 11, in an exemplary embodiment, it is assumed that the first data includes a bit (i.e., the first bit) read from the memory cell 822(1) and a bit (also referred to as a third bit) read from the memory cell 822(3), wherein the memory cell 822(3) is also referred to as a fourth memory cell. It is assumed that the threshold voltage of the memory cell 822(1) belongs to the voltage range 1002, and the threshold voltage of the memory cell 822(3) belongs to the voltage range 1004. According to the lookup table 1100 of FIG. 11, the default reliability information corresponding to the first bit is "−8", and the default reliability information corresponding to the third bit is "+2". In an exemplary embodiment, new reliability information (also referred to as third reliability information) corresponding to the third bit is also determined according to the storage states of the memory cell 821(3) and/or the memory cell 823(3), and the third reliability information corresponding to the third bit is different from the default reliability information corresponding to the third bit. Relevant operations have all been detailed above and will not be repeatedly described here.

In an exemplary embodiment, the reliability information adjustment value corresponding to at least one voltage range may be identical to the reliability information adjustment value corresponding to at least another voltage range. For example, in an exemplary embodiment of FIG. 8, FIG. 10, and FIG. 11, if the threshold voltages of the memory cells 822(1) and 822(3) respectively belong to the voltage ranges 1002 and 1004, a reliability information adjustment value (e.g., $\Delta_1$) for adjusting the default reliability information corresponding to the first bit is identical to a reliability information adjustment value (e.g., $\Delta_2$) for adjusting the default reliability information corresponding to the third bit. Alternatively, in an exemplary embodiment, the reliability information adjustment value corresponding to at least one voltage range may be different from the reliability information adjustment value corresponding to at least another voltage range. For example, in another exemplary embodiment of FIG. 8, FIG. 10, and FIG. 11, if the threshold voltages of the memory cells 822(1) and 822(3) respectively belong to the voltage ranges 1002 and 1004, the reliability information adjustment value for adjusting the default reliability information corresponding to the first bit is different from the reliability information adjustment value for adjusting the default reliability information corresponding to the third bit. In other words, if $\Delta_1$ is the reliability information adjustment value corresponding to the voltage range 1002 and $\Delta_2$ is the reliability information adjustment value corresponding to the voltage range 1004, then $\Delta_1$ may be identical to or different from $\Delta_2$, which is not limited in the disclosure. Alternatively, in an exemplary embodiment, it is possible that all of the voltage ranges correspond to the same or different reliability information adjustment values, which is not limited in the disclosure.

It is noted that in the foregoing exemplary embodiments, as an example of adjusting the reliability information of a bit, the reliability information adjustment value is added to or subtracted from the default reliability information corresponding to the bit. However, the disclosure does not actually limit how to adjust the reliability information corresponding to each of the bits in the first data according to the storage states of the adjacent memory cells. For example, in an exemplary embodiment of FIG. 8 and FIG. 11, if the first data includes a plurality of bits read from the memory cells 822(1)-822(*n*), the default reliability information corresponding to these bits may be input to a specific equation or the reliability information corresponding to these bits may be adjusted by using specific parameters or adjustment ratios with reference to the storage states of the memory cells 821(1)-821(*n*) and/or the memory cells 823(1)-823(*n*), which is not limited in the disclosure. Analogously, the reliability information of each of the bits in the first data may all be adjusted to a value more in line with the actual electronic storage status of the memory cells according to the foregoing operation to thereby enhance the success rate of the subsequent decoding of the first data. Moreover, in another exemplary embodiment, the rule for adding or subtracting the reliability information corresponding to the first bit may be reversed, as long as the reliability information of the first bit can be adjusted to be more in line with the actual electronic storage status of the first memory cell according to the potential electron loss or electron gain of the first memory cell.

It is noted that the disclosure does not limit the reliability information corresponding to which bit(s) of the first data being adjusted. For example, in an exemplary embodiment, the reliability information corresponding to all of the bits in the first data is adjusted in the reliability information adjustment operation performed each time. Alternatively, in another exemplary embodiment, the reliability information corresponding to only part of the bits in the first data is adjusted in one reliability information adjustment operation, which is not limited in the disclosure.

In an exemplary embodiment, the ECCC 608 performs a hard bit mode decoding operation and a soft bit mode decoding operation. Generally, with respect to the same codeword (or a decoding frame), a total number of the error bits that can be corrected in the soft bit mode decoding operation is greater than a total number of the error bits that can be corrected in the hard bit mode decoding operation. Moreover, if a total number of the error bits in a codeword exceeds a predetermined number, a decoding success rate of the soft bit mode decoding operation is also higher than a decoding success rate of the hard bit mode decoding operation. However, a system power consumption for performing the soft bit mode decoding operation is generally higher than a system power consumption for performing the hard bit mode decoding operation, and/or a time required for performing the soft bit mode decoding operation is generally more than a time required for performing the hard bit mode decoding operation.

In the soft bit mode decoding operation, the RVL for reading the first data is also referred to as the soft decision RVL, and the ECCC 608 updates the reliability information corresponding to at least one bit in the first data at least once and repeatedly decodes the first data according to the updated reliability information. In the hard bit mode decoding operation, the MMC 602 also issues the read command sequence to read the first memory cell to obtain the corresponding read data and performs the hard bit mode decoding operation on the read data. It is noted that in the hard bit mode decoding operation, each of the memory cells is read by using one single RVL (also referred to as a hard decision RVL), and the read bit is also referred to as a hard bit.

Taking FIG. 10 as an example, in the soft bit mode decoding operation, the RVLs $V_{S1}$-$V_{S5}$ are used to read the same memory cell to obtain a plurality of soft bits $SB_1$-$SB_5$. However, in the hard bit mode decoding operation, only one single RVL is used to read a memory cell. For example, in an exemplary embodiment, the RVL used in the hard bit mode decoding operation may be identical to the sign RVL of the soft decision RVLs or any one soft decision RVL. Alternatively, in an exemplary embodiment, the RVL used in the hard bit mode decoding operation may also be different from each of the soft decision RVLs. It is noted that the foregoing decoding operations based on the reliability information are all belong to the soft bit mode decoding operations. The hard bit mode decoding operation may not use the reliability information. Moreover, in an exemplary embodiment, the RVL (i.e., the hard decision RVL) used in the hard bit mode decoding operation may be updated at least once.

Figure 13:
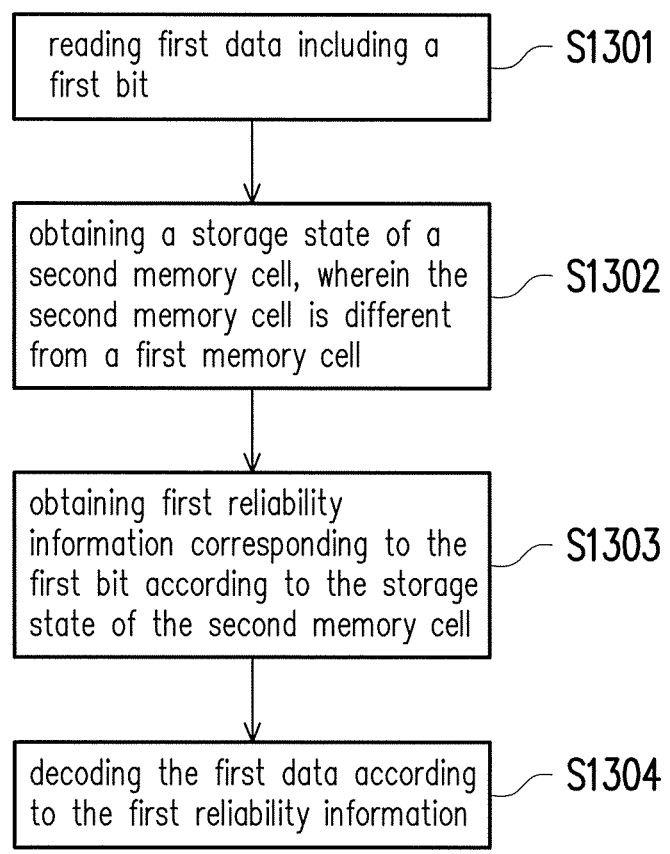
FIG. 13 is a flowchart illustrating a decoding method according to an exemplary embodiment of the disclosure.

FIG. 13 is a flowchart illustrating a decoding method according to an exemplary embodiment of the disclosure.

Referring to FIG. 13, in step S1301, first data including a first bit is read, wherein the first bit is stored in a first memory cell. In step S1302, a storage state of a second memory cell is obtained, wherein the second memory cell is different from the first memory cell. In step S1303, first reliability information corresponding to the first bit is obtained according to the storage state of the second memory cell, wherein the first reliability information corresponding to the first bit is different from default reliability information corresponding to the first bit. In step S1304, the first data is decoded according to the first reliability information.

Figure 14:
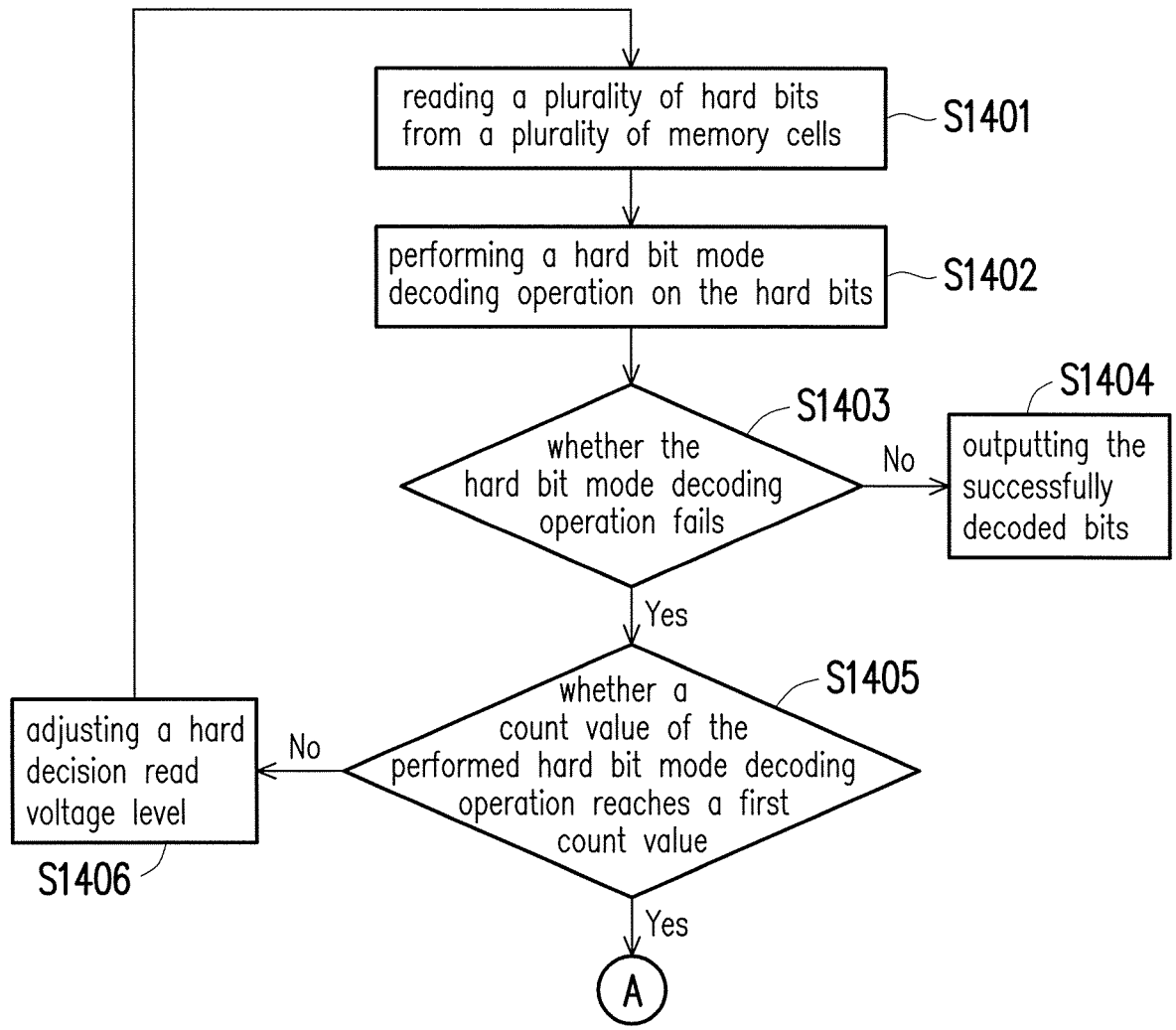
FIG. 14, FIG. 15, and FIG. 16 are flowcharts illustrating a decoding method according to another exemplary embodiment of the disclosure.
Figure 15:
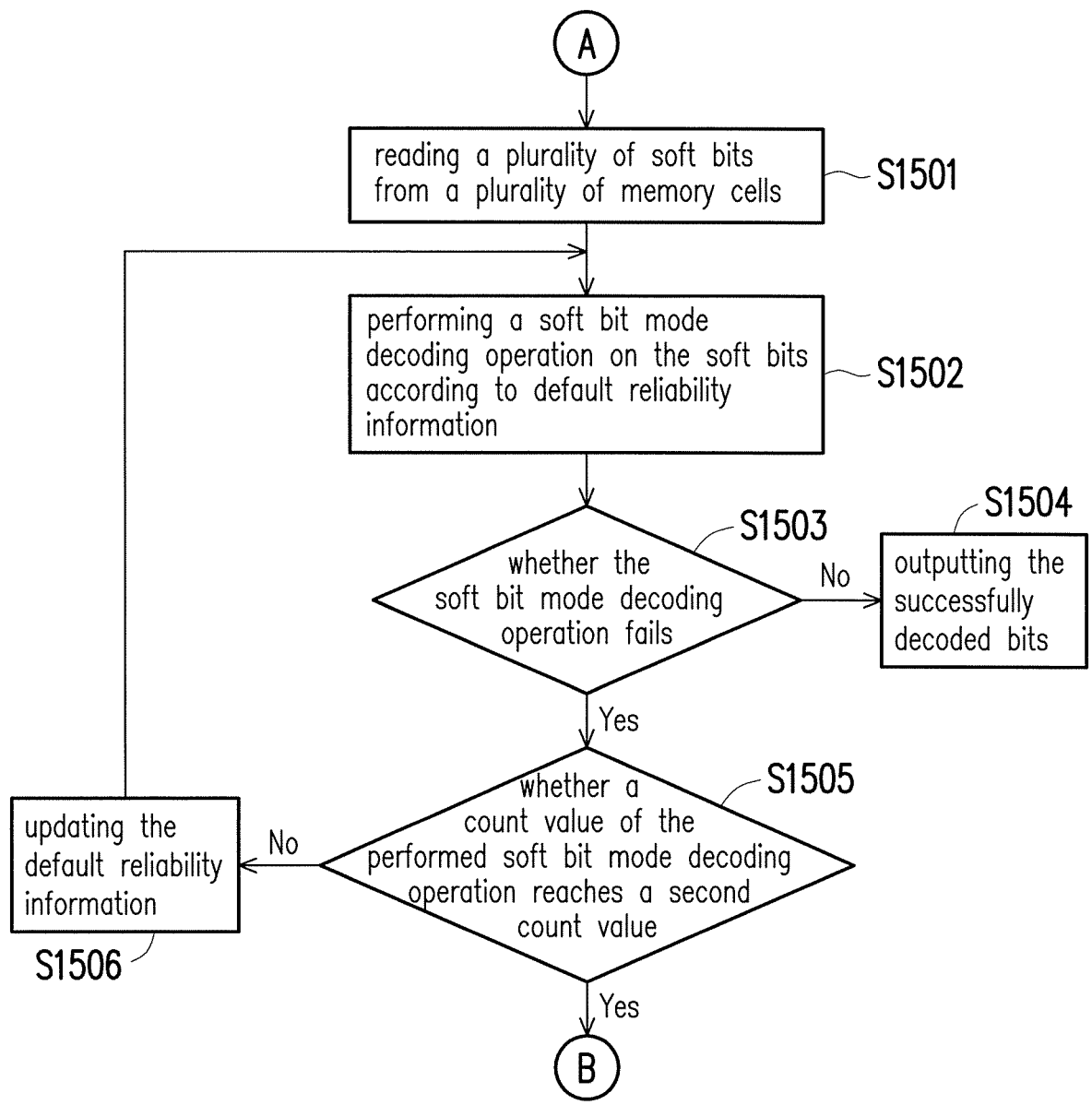
Figure 16:
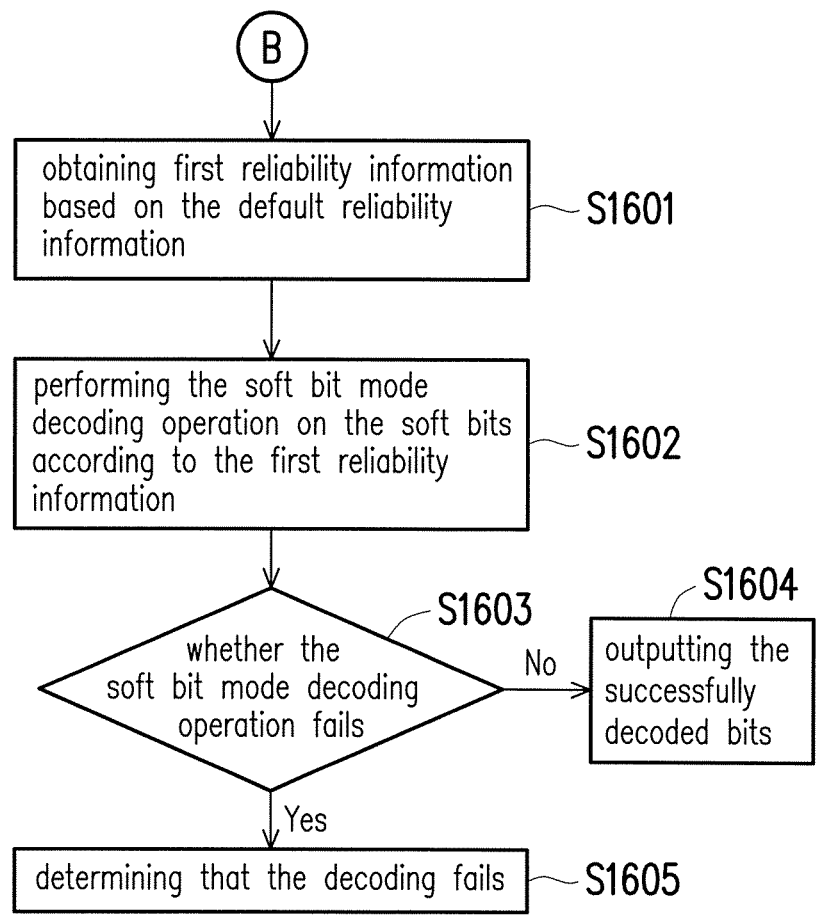

FIG. 14, FIG. 15, and FIG. 16 are flowcharts illustrating a decoding method according to another exemplary embodiment of the disclosure. Referring to FIG. 14, in step S1401, a plurality of hard bits are read from a plurality of memory cells. In step S1402, a hard bit mode decoding operation is performed on the hard bits. In step S1403, it is determined whether the performed hard bit mode decoding operation fails. If the performed hard bit mode decoding operation does not fail (i.e., succeeds), in step S1404, the successfully decoded bits are output. If the performed hard bit mode decoding operation fails, in step S1405, it is determined whether a count value of the performed hard bit mode decoding operation reaches a first count value. If the count value of the performed hard bit mode decoding operation does not reach the first count value, in step S1406, a hard decision RVL is adjusted, and returning to step S1401, the first memory cell is read again by using the adjusted hard decision RVL to obtain new hard bits. Then, step S1402 is performed. However, if the count value of the performed hard bit mode decoding operation reaches the first count value, step S1501 of FIG. 15 is entered after step S1405.

Referring to FIG. 15, in step S1501, a plurality of soft bits are read from a plurality of memory cells. The soft bits include the first data. In step S1502, a soft bit mode decoding operation is performed on the soft bits according to default reliability information corresponding to each of the bits in the first data. In step S1503, it is determined whether the performed soft bit mode decoding operation fails. If the performed soft bit mode decoding operation does not fail, in step S1504, the successfully decoded bits are output. If the performed soft bit mode decoding operation fails, in step S1505, it is determined whether a count value of the performed soft bit mode decoding operation reaches a second count value. If the count value of the performed soft bit mode decoding operation does not reach the second count value, in step S1506, the default reliability information corresponding to at least one bit in the first data is updated. Then, returning to step S1502, the soft bit mode decoding operation is performed again on the soft bits according to the updated default reliability information. Then, step S1503 is performed.

It is noted that in step S1506, the default reliability information is updated according to a predetermined rule and is not updated according to a storage state of a second memory cell adjacent to the first memory cell. For example, in an exemplary embodiment, a plurality of first lookup tables are stored in a RNVM module or a memory control circuit unit. Each of the first lookup tables is similar to the lookup table 1100 of FIG. 11, but the recited default reliability information is different. Therefore, in step S1506, the default reliability information of data bits may be updated by looking up these different first lookup tables. However, if the count value of the performed soft bit mode decoding operation reaches the second count value, step S1601 of FIG. 16 is entered after step S1505.

Referring to FIG. 16, in step S1601, first reliability information is obtained based on the default reliability information. Here, the first reliability information refers to the updated reliability information of the first bit in the first data, and the first reliability information is determined according to the storage state of the second memory cell adjacent to the first memory cell. For example, according to the storage state of the second memory cell, an adjustment value is added to or another adjustment value is subtracted from the default reliability information corresponding to the first bit to obtain the first reliability information corresponding to the first bit. Moreover, the first bit is read from the first memory cell, and the second memory cell is different from the first memory cell.

In step S1602, the soft bit mode decoding operation is performed again on the soft bits according to the first reliability information. In step S1603, it is determined whether the performed soft bit mode decoding operation fails. If the performed soft bit mode decoding operation does not fail, in step S1604, the successfully decoded bits are output. If the performed soft bit mode decoding operation fails, in step S1605, it is determined that the decoding fails. For example, after it is determined that the decoding fails, the MMC 602 may transmit a read fail message to the host system or performs another error processing operation.

It is noted that as an example, the reliability information corresponding to the first bit in the first data is updated as the first reliability information in FIG. 16. However, in an exemplary embodiment, the reliability information corresponding to each of the bits in the first data may all or partially be updated to be different from the default reliability information corresponding to the bits. Then, the next soft bit mode decoding operation may be performed according to the updated reliability information to thereby enhance the decoding success rate.

However, the steps in FIG. 14 to FIG. 16 have been detailed above and will not be repeatedly described here. It is noted that the steps in FIG. 14 to FIG. 16 may be implemented in a plurality of program codes or circuits, which is not limited in the disclosure. Moreover, the method of FIG. 14 to FIG. 16 may operate with the foregoing exemplary embodiments or operate on its own, which is not limited in the disclosure.

In summary of the above, after the first data including the first bit stored in the first memory cell is read, the storage state of the second memory cell adjacent to the first memory cell is obtained. Then, the reliability information corresponding to the first bit is updated based on the storage state of the second memory cell. The updated reliability information is used in the next decoding performed on the first data to thereby enhance the decoding success rate.

The previously described exemplary embodiments of the present disclosure have the advantages aforementioned, wherein the advantages aforementioned are not required in all versions of the disclosure.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:
1. A decoding method for a rewritable non-volatile memory module comprising a plurality of memory cells, the decoding method comprising:

reading first data from at least one memory cell among the memory cells, wherein the first data comprises a first bit, and the first bit is stored in a first memory cell among the memory cells;

decoding the first data according to default reliability information corresponding to the first bit in a soft bit mode decoding operation;

obtaining first reliability information corresponding to the first bit according to a storage state of at least one second memory cell among the memory cells and the default reliability information if the performed soft bit mode decoding operation is failed and a count value of the performed soft bit mode decoding operation reaches a default count value, wherein the at least one second memory cell is different from the first memory cell and the first reliability information is different from the default reliability information corresponding to the first bit; and decoding the first data according to the first reliability information in the soft bit mode decoding operation.

2. The decoding method according to claim 1, wherein the step of obtaining the first reliability information corresponding to the first bit according to the storage state of the at least one second memory cell and the default reliability information comprises:

determining the first reliability information according to the storage state of the at least one second memory cell and a threshold voltage of the first memory cell.

3. The decoding method according to claim 2, wherein the step of determining the first reliability information according to the storage state of the at least one second memory cell and the threshold voltage of the first memory cell comprises:

identifying a first voltage range to which the threshold voltage of the first memory cell belongs; and determining the first reliability information according to the storage state of the at least one second memory cell and the first voltage range.

4. The decoding method according to claim 3, wherein the step of determining the first reliability information according to the storage state of the at least one second memory cell and the first voltage range comprises:

obtaining the default reliability information corresponding to the first voltage range; and determining the first reliability information according to the storage state of the at least one second memory cell and the default reliability information.

5. The decoding method according to claim 1, wherein the step of obtaining the first reliability information according to the storage state of the at least one second memory cell and the default reliability information comprises:

subtracting a first adjustment value from or adding a second adjustment value to the default reliability information according to the storage state of the at least one second memory cell to obtain the first reliability information.

6. The decoding method according to claim 1, further comprising:

updating the default reliability information without reference to the storage state of the at least one second memory cell if the performed soft bit mode decoding operation is failed and the count value of the performed soft bit mode decoding operation does not reach the default count value; and decoding the first data according to the updated default reliability information.

7. The decoding method according to claim 1, wherein the first data further comprises a second bit, and the second bit is stored in a third memory cell among the memory cells, wherein threshold voltages of the first memory cell and the third memory cell both belong to a first voltage range, wherein the step of decoding the first data according to the first reliability information comprises:

obtaining second reliability information corresponding to the second bit, wherein the second reliability information is different from the first reliability information; and decoding the first data according to the first reliability information and the second reliability information.

8. The decoding method according to claim 1, wherein the first data further comprises a third bit, and the third bit is stored in a fourth memory cell among the memory cells, wherein a threshold voltage of the first memory cell belongs to a first voltage range, a threshold voltage of the fourth memory cell belongs to a second voltage range, the second voltage range is different from the first voltage range, and the default reliability information corresponding to the first bit is different from default reliability information corresponding to the third bit.

9. The decoding method according to claim 1, wherein the storage state of the at least one second memory cell corresponds to bit data stored in the at least one second memory cell.

10. The decoding method according to claim 1, wherein the rewritable non-volatile memory module comprises a plurality of word line layers disposed by stacking, wherein the first memory cell is disposed on a first word line layer among the word line layers, the at least one second memory cell is disposed on at least one second word line layer among the word line layers, and the first word line layer is adjacent to the at least one second word line layer.

11. The decoding method according to claim 1, wherein the step of obtaining the first reliability information corresponding to the first bit according to the storage state of the at least one second memory cell and the default reliability information comprises:

subtracting a first adjustment value from the default reliability information corresponding to the first bit if the storage state of the at least one second memory cell is a first state; and adding a second adjustment value to the default reliability information corresponding to the first bit if the storage state of the at least one second memory cell is a second state, wherein a memory cell voltage corresponding to the first state is different from a memory cell voltage corresponding to the second state.

12. A memory storage device comprising:

a connection interface unit configured to couple to a host system;

a rewritable non-volatile memory module comprising a plurality of memory cells; and a memory control circuit unit coupled to the connection interface unit and the rewritable non-volatile memory module, wherein the memory control circuit unit is configured to issue a read command sequence configured to instruct reading first data from at least one memory cell among the memory cells, wherein the first data comprises a first bit, and the first bit is stored in a first memory cell among the memory cells, wherein the memory control circuit unit is further configured to decode the first data according to default reliability information corresponding to the first bit in a soft bit mode decoding operation, wherein the memory control circuit unit is further configured to obtain first reliability information corresponding to the first bit according to a storage state of at least one second memory cell among the memory cells and the default reliability information if the performed soft bit mode decoding operation is failed and a count value of the performed soft bit mode decoding operation reaches a default count value, wherein the at least one second memory cell is different from the first memory cell and the first reliability information is different from the default reliability information corresponding to the first bit, wherein the memory control circuit unit is further configured to decode the first data according to the first reliability information in the soft bit mode decoding operation.

13. The memory storage device according to claim 12, wherein the configured operation of obtaining the first reliability information corresponding to the first bit according to the storage state of the at least one second memory cell and the default reliability information by the memory control circuit unit comprises:

determining the first reliability information according to the storage state of the at least one second memory cell and a threshold voltage of the first memory cell.

14. The memory storage device according to claim 13, wherein the configured operation of determining the first reliability information according to the storage state of the at least one second memory cell and the threshold voltage of the first memory cell by the memory control circuit unit comprises:

identifying a first voltage range to which the threshold voltage of the first memory cell belongs; and determining the first reliability information according to the storage state of the at least one second memory cell and the first voltage range.

15. The memory storage device according to claim 14, wherein the configured operation of determining the first reliability information according to the storage state of the at least one second memory cell and the first voltage range by the memory control circuit unit comprises:

obtaining the default reliability information corresponding to the first voltage range; and determining the first reliability information according to the storage state of the at least one second memory cell and the default reliability information.

16. The memory storage device according to claim 12, wherein the configured operation of obtaining the first reliability information according to the storage state of the at least one second memory cell and the default reliability information by the memory control circuit unit comprises:

subtracting a first adjustment value from or adding a second adjustment value to the default reliability information according to the storage state of the at least one second memory cell to obtain the first reliability information.

17. The memory storage device according to claim 12, wherein the memory control circuit unit is further configured to update the default reliability information without reference to the storage state of the at least one second memory cell if the performed soft bit mode decoding operation is failed and the count value of the performed soft bit mode decoding operation does not reach the default count value, and the memory control circuit unit is further configured to decode the first data according to the updated default reliability information.

18. The memory storage device according to claim 12, wherein the first data further comprises a second bit, and the second bit is stored in a third memory cell among the memory cells, wherein threshold voltages of the first memory cell and the third memory cell both belong to a first voltage range, wherein the configured operation of decoding the first data according to the first reliability information by the memory control circuit unit comprises:

obtaining second reliability information corresponding to the second bit, wherein the second reliability information is different from the first reliability information; and decoding the first data according to the first reliability information and the second reliability information.

19. The memory storage device according to claim 12, wherein the first data further comprises a third bit, and the third bit is stored in a fourth memory cell among the memory cells, wherein a threshold voltage of the first memory cell belongs to a first voltage range, a threshold voltage of the fourth memory cell belongs to a second voltage range, the second voltage range is different from the first voltage range, and the default reliability information corresponding to the first bit is different from default reliability information corresponding to the third bit.

20. The memory storage device according to claim 12, wherein the storage state of the at least one second memory cell corresponds to bit data stored in the at least one second memory cell.

21. The memory storage device according to claim 12, wherein the rewritable non-volatile memory module comprises a plurality of word line layers disposed by stacking, wherein the first memory cell is disposed on a first word line layer among the word line layers, the at least one second memory cell is disposed on at least one second word line layer among the word line layers, and the first word line layer is adjacent to the at least one second word line layer.

22. The memory storage device according to claim 12, wherein the configured operation of obtaining the first reliability information corresponding to the first bit according to the storage state of the at least one second memory cell by the memory control circuit unit and the default reliability information comprises:

subtracting a first adjustment value from the default reliability information corresponding to the first bit if the storage state of the at least one second memory cell is a first state; and adding a second adjustment value to the default reliability information corresponding to the first bit if the storage state of the at least one second memory cell is a second state, wherein a memory cell voltage corresponding to the first state is different from a memory cell voltage corresponding to the second state.

23. A memory control circuit unit configured to control a rewritable non-volatile memory module comprising a plurality of memory cells, the memory control circuit unit comprising:

a host interface configured to couple to a host system;
a memory interface configured to couple to the rewritable non-volatile memory module;
an error checking and correcting circuit; and
a memory management circuit coupled to the host interface, the memory interface, and the error checking and correcting circuit,
wherein the memory management circuit is configured to issue a read command sequence configured to instruct reading first data from at least one memory cell among the memory cells, wherein the first data comprises a first bit, and the first bit is stored in a first memory cell among the memory cells,
wherein the error checking and correcting circuit is configured to decode the first data according to default reliability information corresponding to the first bit in a soft bit mode decoding operation,
wherein the memory management circuit is further configured to obtain first reliability information corresponding to the first bit according to a storage state of at least one second memory cell among the memory cells and the default reliability information if the performed soft bit mode decoding operation is failed and a count value of the performed soft bit mode decoding operation reaches a default count value, wherein the at least one second memory cell is different from the first memory cell and the first reliability information is different from the default reliability information corresponding to the first bit,
wherein the error checking and correcting circuit is further configured to decode the first data according to the first reliability information in the soft bit mode decoding operation.

24. The memory control circuit unit according to claim 23, wherein the configured operation of obtaining the first reliability information corresponding to the first bit according to the storage state of the at least one second memory cell and the default reliability information by the memory management circuit comprises:
determining the first reliability information according to the storage state of the at least one second memory cell and a threshold voltage of the first memory cell.

25. The memory control circuit unit according to claim 24, wherein the configured operation of determining the first reliability information according to the storage state of the at least one second memory cell and the threshold voltage of the first memory cell by the memory management circuit comprises:
identifying a first voltage range to which the threshold voltage of the first memory cell belongs; and
determining the first reliability information according to the storage state of the at least one second memory cell and the first voltage range.

26. The memory control circuit unit according to claim 25, wherein the configured operation of determining the first reliability information according to the storage state of the at least one second memory cell and the first voltage range comprises:
obtaining the default reliability information corresponding to the first voltage range; and
determining the first reliability information according to the storage state of the at least one second memory cell and the default reliability information.

27. The memory control circuit unit according to claim 23, wherein the configured operation of obtaining the first reliability information according to the storage state of the at least one second memory cell and the default reliability information by the memory management circuit comprises:
subtracting a first adjustment value from or adding a second adjustment value to the default reliability information according to the storage state of the at least one second memory cell to obtain the first reliability information.

28. The memory control circuit unit according to claim 23, wherein the memory management circuit is further configured to update the default reliability information without reference to the storage state of the at least one second memory cell if the performed soft bit mode decoding operation is failed and the count value of the performed soft bit mode decoding operation does not reach the default count value, and
the error checking and correcting circuit is further configured to decode the first data according to the updated default reliability information.

29. The memory control circuit unit according to claim 23, wherein the first data further comprises a second bit, and the second bit is stored in a third memory cell among the memory cells,
wherein threshold voltages of the first memory cell and the third memory cell both belong to a first voltage range,
wherein the configured operation of decoding the first data according to the first reliability information by the error checking and correcting circuit comprises:
obtaining second reliability information corresponding to the second bit, wherein the second reliability information is different from the first reliability information; and
decoding the first data according to the first reliability information and the second reliability information.

30. The memory control circuit unit according to claim 23, wherein the first data further comprises a third bit, and the third bit is stored in a fourth memory cell among the memory cells,
wherein a threshold voltage of the first memory cell belongs to a first voltage range, a threshold voltage of the fourth memory cell belongs to a second voltage range, the second voltage range is different from the first voltage range, and the default reliability information corresponding to the first bit is different from default reliability information corresponding to the third bit.

31. The memory control circuit unit according to claim 23, wherein the storage state of the at least one second memory cell corresponds to bit data stored in the at least one second memory cell.

32. The memory control circuit unit according to claim 23, wherein the rewritable non-volatile memory module comprises a plurality of word line layers disposed by stacking, wherein the first memory cell is disposed on a first word line layer among the word line layers, the at least one second memory cell is disposed on at least one second word line layer among the word line layers, and the first word line layer is adjacent to the at least one second word line layer.

33. The memory control circuit unit according to claim 23, wherein the configured operation of obtaining the first reliability information corresponding to the first bit according to the storage state of the at least one second memory cell and the default reliability information by the memory management circuit comprises:

subtracting a first adjustment value from the default reliability information corresponding to the first bit if the storage state of the at least one second memory cell is a first state; and adding a second adjustment value to the default reliability information corresponding to the first bit if the storage state of the at least one second memory cell is a second state, wherein a memory cell voltage corresponding to the first state is different from a memory cell voltage corresponding to the second state.

* * * * *